(12) United States Patent
Masuda et al.

(10) Patent No.: US 9,474,147 B2
(45) Date of Patent: Oct. 18, 2016

(54) SOCKET FOR SEMICONDUCTOR COMPONENT, PRINTED CIRCUIT BOARD UNIT, AND INFORMATION PROCESSING APPARATUS

(71) Applicant: FUJITSU LIMITED, Kawasaki-shi, Kanagawa (JP)

(72) Inventors: Yasushi Masuda, Kawasaki (JP); Akira Tamura, Yokohama (JP); Yoshihiro Morita, Yokohama (JP); Satoshi Ohsawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/684,470

(22) Filed: Apr. 13, 2015

(65) Prior Publication Data

US 2015/0359122 A1    Dec. 10, 2015

(30) Foreign Application Priority Data

Jun. 10, 2014    (JP) ................................. 2014-119608

(51) Int. Cl.

| | |
|---|---|
| *H01R 12/00* | (2006.01) |
| *H05K 1/02* | (2006.01) |
| *H01R 12/70* | (2011.01) |
| *H01R 13/6588* | (2011.01) |
| *H05K 7/10* | (2006.01) |
| *H01R 12/52* | (2011.01) |
| *H01R 13/24* | (2006.01) |

(52) U.S. Cl.
CPC ........ *H05K 1/0216* (2013.01); *H01R 12/7076* (2013.01); *H01R 12/7082* (2013.01); *H01R 13/6588* (2013.01); *H05K 7/1069* (2013.01); *H01R 9/096* (2013.01); *H01R 12/52* (2013.01); *H01R 13/2435* (2013.01)

(58) Field of Classification Search
CPC ... H01R 12/52; H01R 13/2435; H01R 9/096
USPC .................. 439/66, 91, 591, 607.08, 607.07
See application file for complete search history.

(56) References Cited

U.S. PATENT DOCUMENTS

| | | | | |
|---|---|---|---|---|
| 8,491,337 B2* | 7/2013 | Cai | ........................ | H01R 12/57 439/607.28 |
| 8,535,093 B1* | 9/2013 | Mason | ............... | H01R 13/6585 439/607.05 |
| 8,821,188 B2* | 9/2014 | Chang | ................ | H01R 13/6586 439/607.01 |

(Continued)

FOREIGN PATENT DOCUMENTS

| | | |
|---|---|---|
| JP | 2001-326298 | 11/2001 |
| JP | 2006-24654 | 1/2006 |

*Primary Examiner* — Tho D Ta
*Assistant Examiner* — Thang Nguyen
(74) *Attorney, Agent, or Firm* — Fujitsu Patent Center

(57) ABSTRACT

A disclosed socket for a semiconductor component includes a plate-shaped insulator having a first main surface and a second main surface, where a through hole being formed in the insulator, a terminal inserted in the through hole, the terminal having one end configured to be connected to a signal electrode of the semiconductor component and having another end configured to be connected to a signal electrode of a printed circuit board, and a shield buried in the insulator to surround the terminal from sides of the terminal, the shield including a first contact protruding from the first main surface and configured to be connected to a ground electrode of the semiconductor component, and a second contact protruding from the second main surface and configured to be connected to a ground electrode of the printed circuit board.

9 Claims, 34 Drawing Sheets

(56) References Cited

U.S. PATENT DOCUMENTS

| | | | |
|---|---|---|---|
| 2004/0147140 A1* | 7/2004 | Fan | H01R 13/2421 439/66 |
| 2004/0253845 A1* | 12/2004 | Brown | H01L 24/72 439/66 |
| 2006/0046527 A1* | 3/2006 | Stone | H01R 13/2442 439/66 |
| 2006/0154497 A1* | 7/2006 | Amemiya | G01R 1/07314 439/66 |
| 2007/0246253 A1 | 10/2007 | Yakabe et al. | |
| 2009/0124100 A1* | 5/2009 | Mason | H05K 7/1061 439/66 |
| 2011/0070750 A1* | 3/2011 | Reisinger | H01R 12/7082 439/66 |
| 2012/0184151 A1* | 7/2012 | Hsu | H01R 13/24 439/660 |
| 2013/0183861 A1* | 7/2013 | Chang | H05K 7/1069 439/607.35 |
| 2014/0017942 A1* | 1/2014 | Mason | H01R 12/714 439/607.17 |
| 2014/0154918 A1* | 6/2014 | Chang | H01R 13/6585 439/607.01 |
| 2014/0162472 A1* | 6/2014 | Walden | H01R 12/714 439/66 |
| 2014/0242816 A1* | 8/2014 | Rathburn | H01R 12/52 439/68 |

* cited by examiner

SOCKET FOR SEMICONDUCTOR COMPONENT, PRINTED CIRCUIT BOARD UNIT, AND INFORMATION PROCESSING APPARATUS

CROSS-REFERENCE TO RELATED APPLICATION(s)

This application is based upon and claims the benefit of priority of the prior Japanese Patent Application No. 2014-119608, filed on Jun. 10, 2014, the entire contents of which are incorporated herein by reference.

FIELD

The embodiments discussed herein are related to a socket for a semiconductor component, a printed circuit board unit, and an information processing apparatus.

BACKGROUND

Semiconductor components such as CPUs (Central Processing Units) are sometimes mounted onto printed circuit boards using sockets. Such sockets include, for example, LGA (Land Grid Array) sockets and BGA (Ball Grid Array) sockets.

In such a socket, a plurality of conductive terminals are provided so that a semiconductor component and a printed circuit board may be electrically connected. The terminals are provided to correspond to electrodes of the semiconductor component, and include signal terminals, grounding terminals and the like, for example.

Among these terminals, signal terminals are preferably protected from noise as much as possible. To achieve this, it is preferable to shield the signal terminals with a conductor. This shielding can prevent cross talk between terminals, and can also provide impedance matching.

Note that techniques relating to the present application are disclosed in Japanese Laid-open Patent Publication Nos. 2006-24654 and 2001-326298.

SUMMARY

According to one aspect discussed herein, there is provided a socket for a semiconductor component including a plate-shaped insulator having a first main surface and a second main surface, where the first main surface and the second main surface being a top surface and a bottom surface of the insulator, and a through hole being formed in the insulator, a terminal inserted in the through hole, the terminal having one end configured to be connected to a signal electrode of the semiconductor component and having another end configured to be connected to a signal electrode of a printed circuit board, and a shield buried in the insulator to surround the terminal from sides of the terminal, the shield including a first contact protruding from the first main surface and configured to be connected to a ground electrode of the semiconductor component, and a second contact protruding from the second main surface and configured to be connected to a ground electrode of the printed circuit board.

Moreover, according to another aspect discussed herein, there is provided a printed circuit board unit including a printed circuit board, and a socket for a semiconductor component connected to the printed circuit board, wherein the socket for the semiconductor component includes a plate-shaped insulator having a first main surface and a second main surface, where the first main surface and the second main surface being a top surface and a bottom surface of the insulator, and a through hole being formed in the insulator, a terminal inserted in the through hole, the terminal having one end configured to be connected to a signal electrode of the semiconductor component and having another end connected to a signal electrode of the printed circuit board, and a shield buried in the insulator to surround the terminal from sides of the terminal, the shield including a first contact protruding from the first main surface and configured to be connected to a ground electrode of the semiconductor component and a second contact protruding from the second main surface and connected to a ground electrode of the printed circuit board.

Further, according to yet another aspect discussed herein, there is provided an information processing apparatus including a printed circuit board, a semiconductor component, and a socket for the semiconductor component connected to the printed circuit board, the semiconductor component being attached to the socket for the semiconductor component, wherein the socket for the semiconductor component includes a plate-shaped insulator having a first main surface and a second main surface, where the first main surface and the second main surface being a top surface and a bottom surface of the insulator, and a through hole being formed in the insulator, a terminal inserted in the through hole, the terminal having one end connected to a signal electrode of the semiconductor component and having another end connected to a signal electrode of the printed circuit board, and a shield buried in the insulator to surround the terminal from sides of the terminal, the shield including a first contact protruding from the first main surface and connected to a ground electrode of the semiconductor component and a second contact protruding from the second main surface and connected to a ground electrode of the printed circuit board.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before the explanation of embodiments, matters examined by the inventors of the present application will be described.

As described previously, in a socket for the semiconductor component such as an LGA socket, it is preferable to surround a signal terminal with a conductor to shield the terminal.

Figure 1:
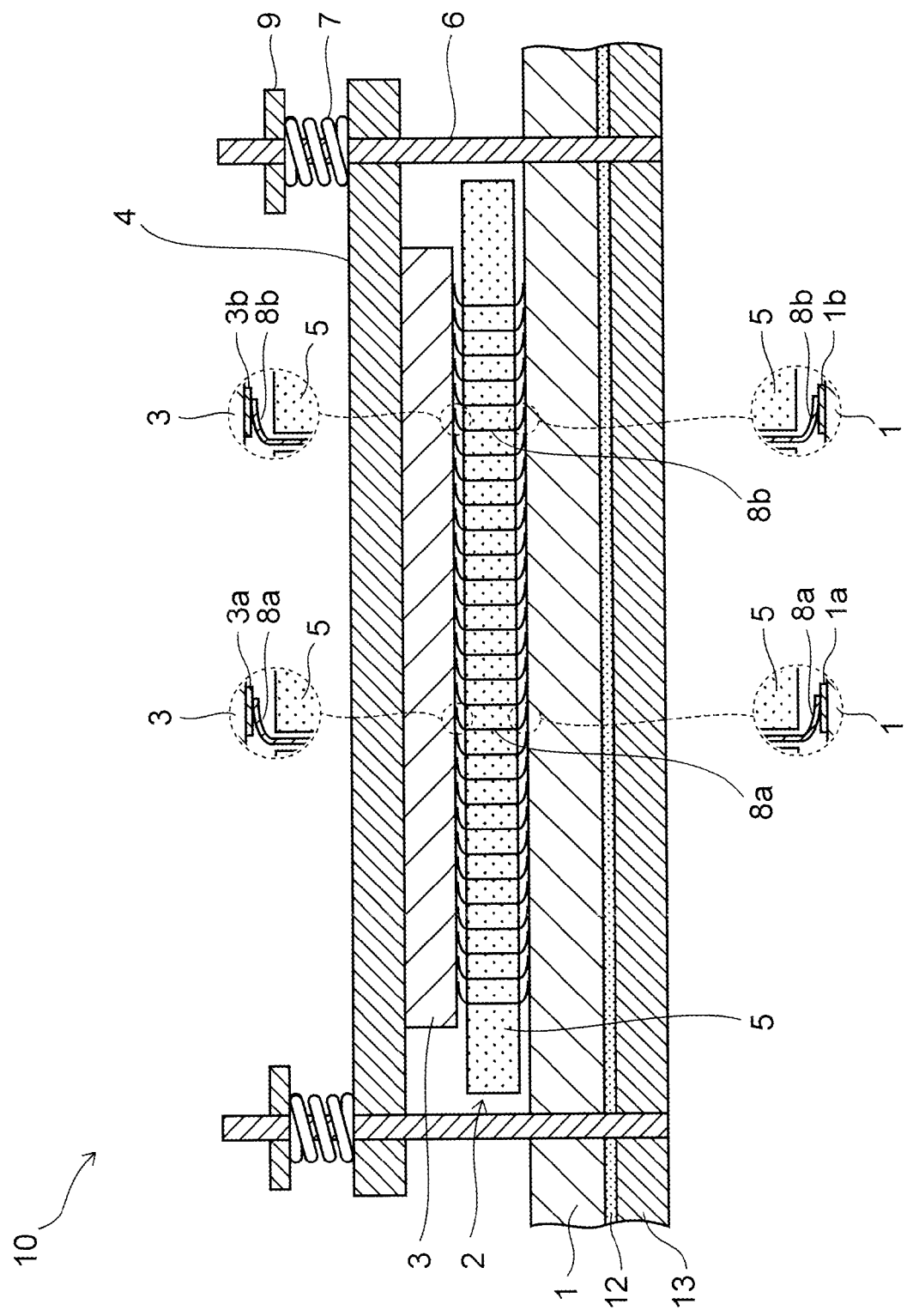
FIG. 1 is a cross-sectional view of an information processing apparatus using a socket for semiconductor component with shielding.

FIG. 1 is a cross-sectional view of an information processing apparatus 10 using a socket for semiconductor component with the above-described shielding.

This information processing apparatus 10 is a server or a personal computer, and includes a printed circuit board 1 and a semiconductor component 3 such as a CPU attached to the printed circuit board 1 with a socket 2 for a semiconductor component interposed therebetween.

The printed circuit board 1 is a circuit board such as a mother board, and includes unillustrated interconnections electrically connected to the semiconductor component 3 through the socket 2.

Meanwhile, the socket 2 for the semiconductor component is an LGA socket, and has a structure in which a plurality of signal terminals 8a and a plurality of ground terminals 8b are buried in a plate-shaped resin insulator 5.

These terminals 8a and 8b are pieces of metal such as copper which have spring properties, and can elastically deform in the thickness direction of the socket 2 for the semiconductor component. Further, the contact of the terminals 8a and 8b with each of the printed circuit board 1 and the semiconductor component 3 by elastic forces thereof causes the printed circuit board 1 and the semiconductor component 3 to be electrically connected to each other.

As illustrated in dotted circles of FIG. 1, signal electrodes 3a and ground electrodes 3b are provided on the semiconductor component 3. Then, signal electrodes 1a and ground electrodes 1b are provided on the printed circuit board 1 to face the electrodes 3a and 3b, respectively.

The signal electrodes 1a are electrodes for exclusively sending and receiving signals to and from the semiconductor component 3, and are connected to the signal electrodes 3a of the semiconductor component 3 through the aforementioned signal terminals 8a, respectively.

Meanwhile, the ground electrodes 1b are electrodes for grounding the semiconductor component 3, and are connected to the ground electrodes 3b of the semiconductor component 3 through the aforementioned ground terminals 8b.

It should be noted that the terminals 8a and 8b are merely in contact with the printed circuit board 1 and the semiconductor component 3 by the elastic forces thereof, and are not fixed to either the printed circuit board 1 or the semiconductor component 3.

Moreover, a plate 4 is provided on a back surface of the semiconductor component 3, and a back plate 13 is provided on a back surface of the printed circuit board 1 with an insulating sheet 12 interposed therebetween. Further, screws 6 are inserted through the plate 4, and one ends of the screws 6 are fixed to the back plate 13. Moreover, nuts are provided on another ends of the screws 6. The semiconductor component 3 is pressed toward the printed circuit board 1 by biasing forces of springs 7 provided between the nuts 9 and the plate 4.

In the above-described socket 2 for the semiconductor component, since neither the printed circuit board 1 nor the semiconductor component 3 is fixed to the terminals 8a and 8b, the socket 2 for the semiconductor component is attachable to and detachable from the printed circuit board 1 and the semiconductor component 3.

Figure 2:
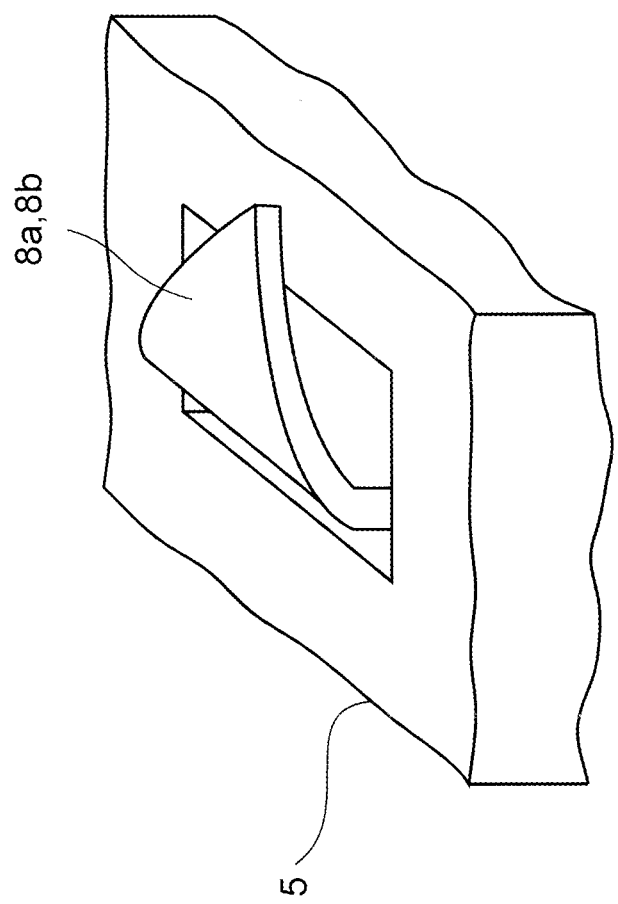
FIG. 2 is a perspective view of a tip of terminals and their surroundings.

FIG. 2 is a perspective view of a tip of terminals 8a and 8b and their surroundings.

As illustrated in FIG. 2, the terminal 8a and 8b protrudes from a surface of the insulator 5, and the tip of the terminal 8a and 8b is bend to be directed in a direction along the surface of the insulator 5.

Figure 3:
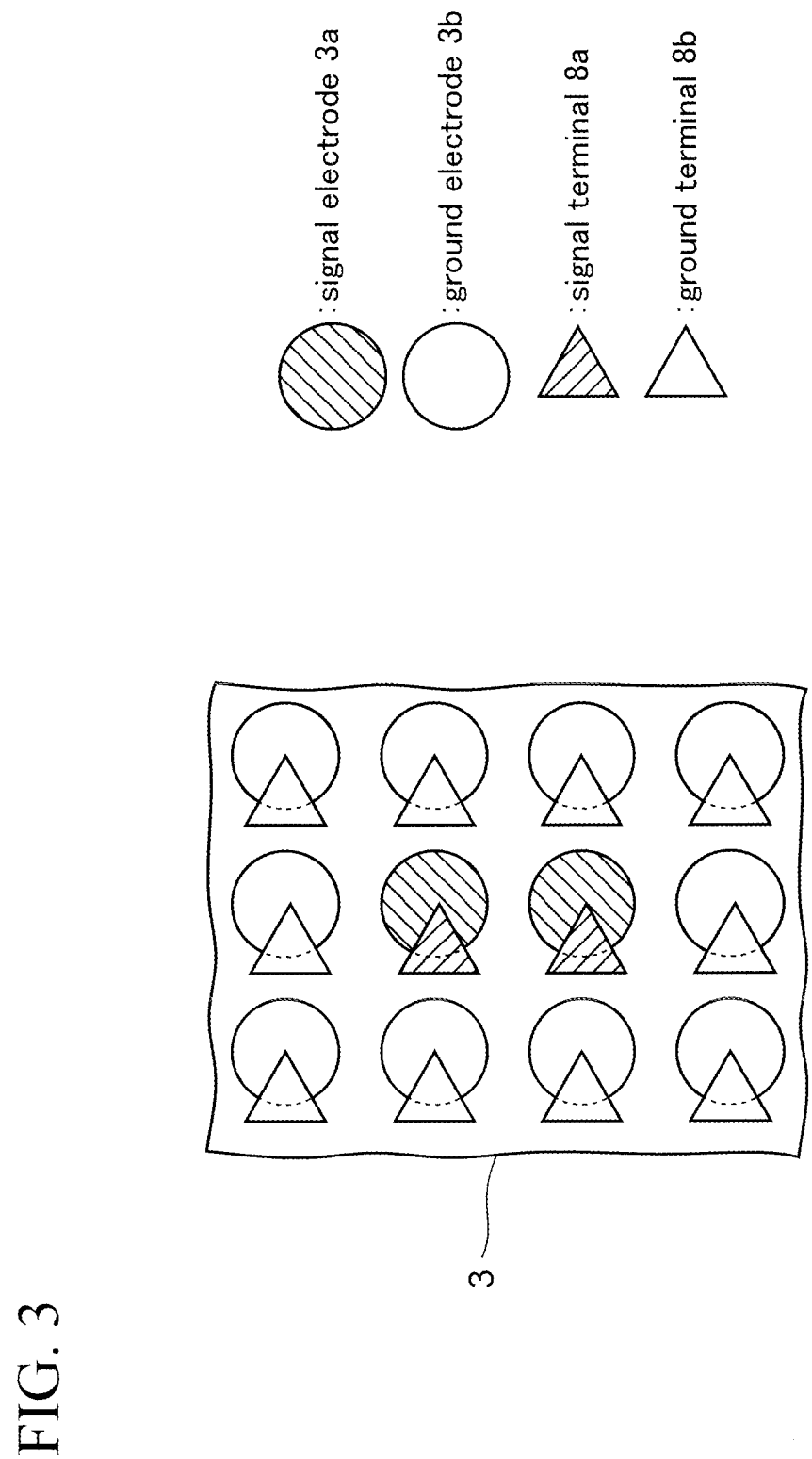
FIG. 3 is a plan view illustrating the arrangement of electrodes of a semiconductor component and terminals of the socket for semiconductor component.

FIG. 3 is a plan view illustrating the arrangement of the electrodes 3a and 3b of the semiconductor component 3 and the terminals 8a and 8b of the socket 2 for the semiconductor component.

The electrodes 3a and 3b are formed in circular shapes by patterning a conductive film such as a copper film, and arranged in the form of a grid on a surface of the semiconductor component 3. Further, the terminals 8a and 8b are also arranged in the form of a grid in planar view in accordance with the arrangement of the electrodes 3a and 3b.

In this example, it is assumed that differential signals are supplied to two central signal electrodes 3a. These signal electrodes 3a are surrounded by ten ground electrodes 3b. This provides a structure in which signal terminals 8a are surrounded by ground terminals 8b. Accordingly, the signal terminals 8a are shielded with the ten ground terminals 8b, and noise introduced to the signal terminals 8a can be reduced.

In particular, in the semiconductor component 3 such as a CPU or the like, differential signals having a high resistant to noise are frequently employed. Therefore, the practical benefit of shielding the signal terminals 8a for differential signals is high in the semiconductor component 3.

However, in the structure of FIG. 3, in order to shield the two signal electrodes 3a for differential signals, ten ground electrodes 3b need to be provided around the two signal electrodes 3a. This reduces a space for providing other signal electrodes 3a on the semiconductor component 3, and makes it difficult to densely dispose electrodes 3a and 3b on the semiconductor component 3.

Figure 4:
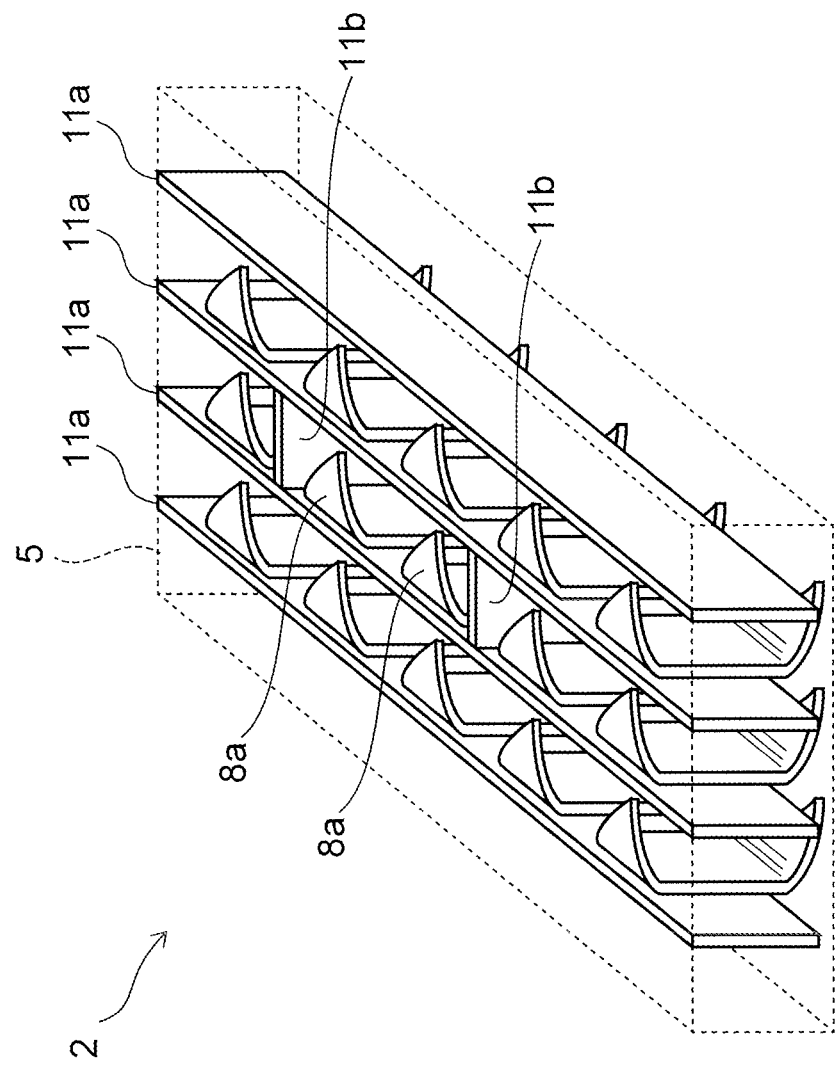
FIG. 4 is a schematic perspective view of a socket for semiconductor component examined by the inventors of the present application.

In order to solve this problem, the inventors of the present application examined the socket 2 for the semiconductor component illustrated in FIG. 4.

FIG. 4 is a schematic perspective view of the socket 2 for the semiconductor component examined by the inventors of the present application.

In this socket 2 for the semiconductor component, two kinds of shield plates 11a and 11b surrounding the aforementioned two signal terminals 8a for differential signals are buried in the insulator 5 so that the signal terminals 8a may be shielded with the shield plates 11a and 11b.

The shield plates 11a and 11b extend in row and column directions of the arrangement of the terminals 8a and 8b, and are formed by machining a metal plate such as a copper plate.

Unlike the example in FIG. 3, this structure eliminates the need to provide the ground electrodes 3b for shielding on the semiconductor component 3 for the purpose of shielding the signal terminals 8a. Accordingly, more signal electrodes 3a can be provided on the semiconductor component 3 than in the case of FIG. 3.

However, the shield plates 11a and 11b are not electrically connected to other components. Accordingly, the electric potentials of the shield plates 11a and 11b fluctuate rather than becoming the ground potential, and noise may be introduced to the signal terminals 8a inside the shield plates 11a and 11b.

Hereinafter, embodiments will be described in which the shield plates are reliably maintained at the ground potential.

First Embodiment

Figure 5:
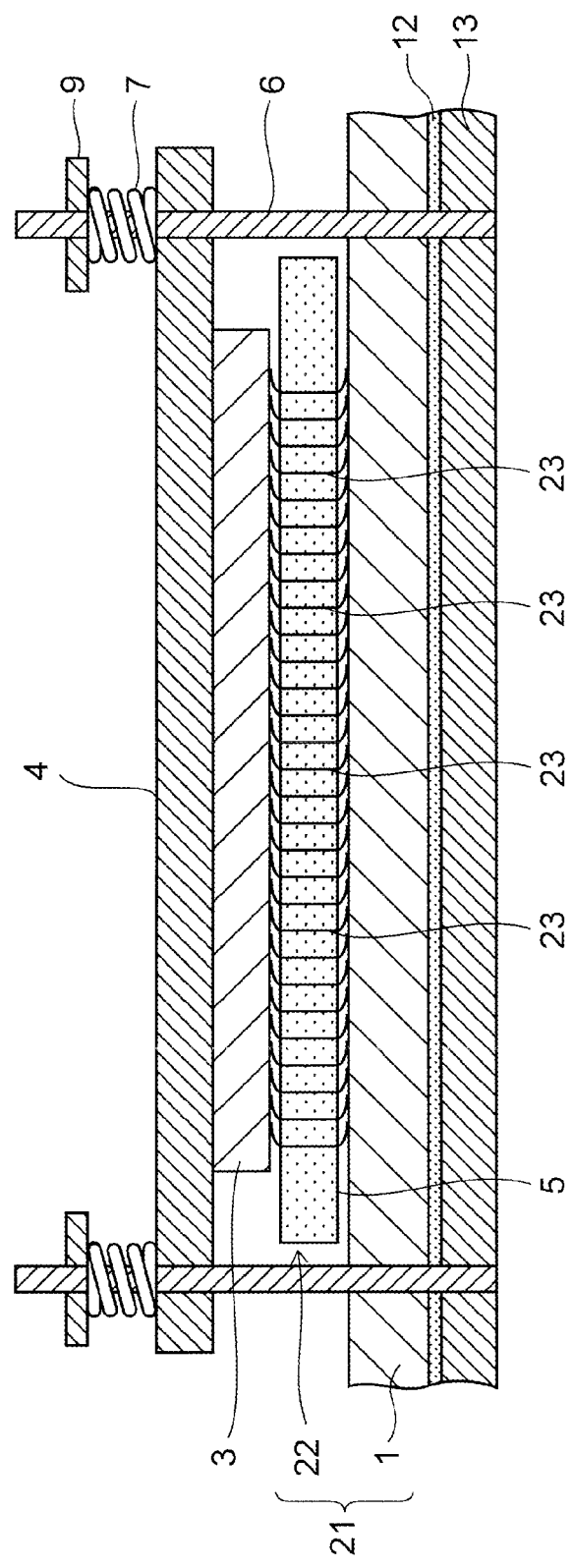
FIG. 5 is a cross-sectional view of an information processing apparatus according to a first embodiment.

FIG. 5 is a cross-sectional view of an information processing apparatus 20 according to the present embodiment. It should be noted that in FIG. 5, the same components as those described in FIG. 1 are denoted by the same reference numerals as those in FIG. 1, and will not be further described below.

The information processing apparatus 20 is a server or a personal computer, and includes a printed circuit board unit 21.

The printed circuit board unit 21 includes a printed circuit board 1 and a socket 22 for the semiconductor component provided thereon, and a semiconductor component 3 is attached to the socket 22 for the semiconductor component. The type of the semiconductor component 3 is not particularly limited, and a CPU, a GPU, or the like can be used as the semiconductor component 3.

The socket 22 for the semiconductor component is an LGA socket, and includes a plate-shaped resin insulator 5 and terminals 23. The terminals 23 are pieces of metal such as copper which have spring properties, and are pressed to each of the printed circuit board 1 and the semiconductor component 3 by biasing forces of springs 7.

Similar to the example of FIG. 1, in the present embodiment, the socket 22 for the semiconductor component is not fixed to either the printed circuit board 1 or the semiconductor component 3, and the socket 22 is attachable to and detachable from the printed circuit board 1 and the semiconductor component 3.

Figure 6:
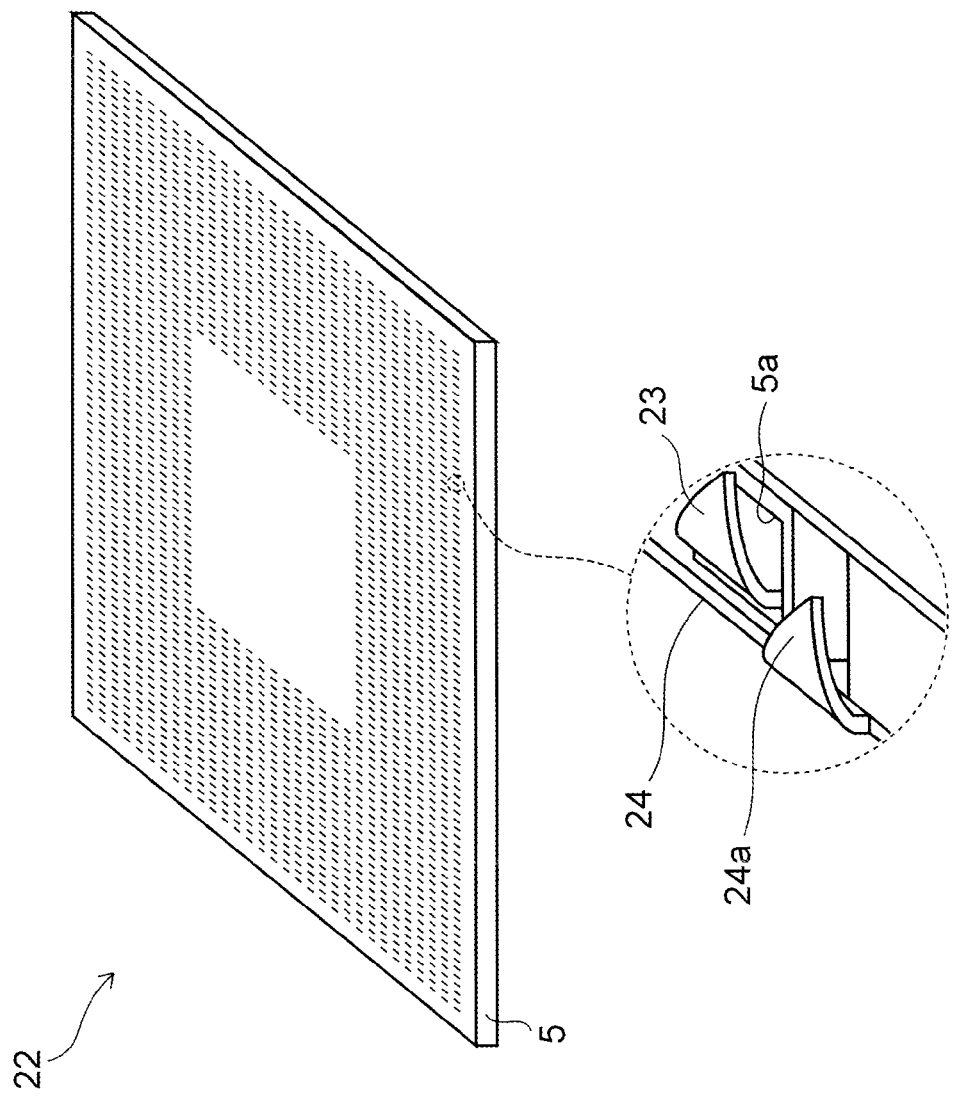
FIG. 6 is a perspective view of a socket for semiconductor component according to the first embodiment.

FIG. 6 is a perspective view of the socket 22 for the semiconductor component.

The insulator 5 of the socket 22 has through hole 5a, and the aforementioned terminals 23 protrude from the through holes 5a.

The material of the insulator 5 is not particularly limited. The insulator 5 can be made of insulating resin material such as LCP (Liquid Crystal Polymer).

Further, first shield plates 24 made of copper or the like are buried in the insulator 5. The first shield plates 24 function as part of a shield electromagnetically shielding the terminals 23 as described later. Also, the first shield plates 24 have first contacts 24a for grounding which protrude from the insulator 5.

Figure 7:
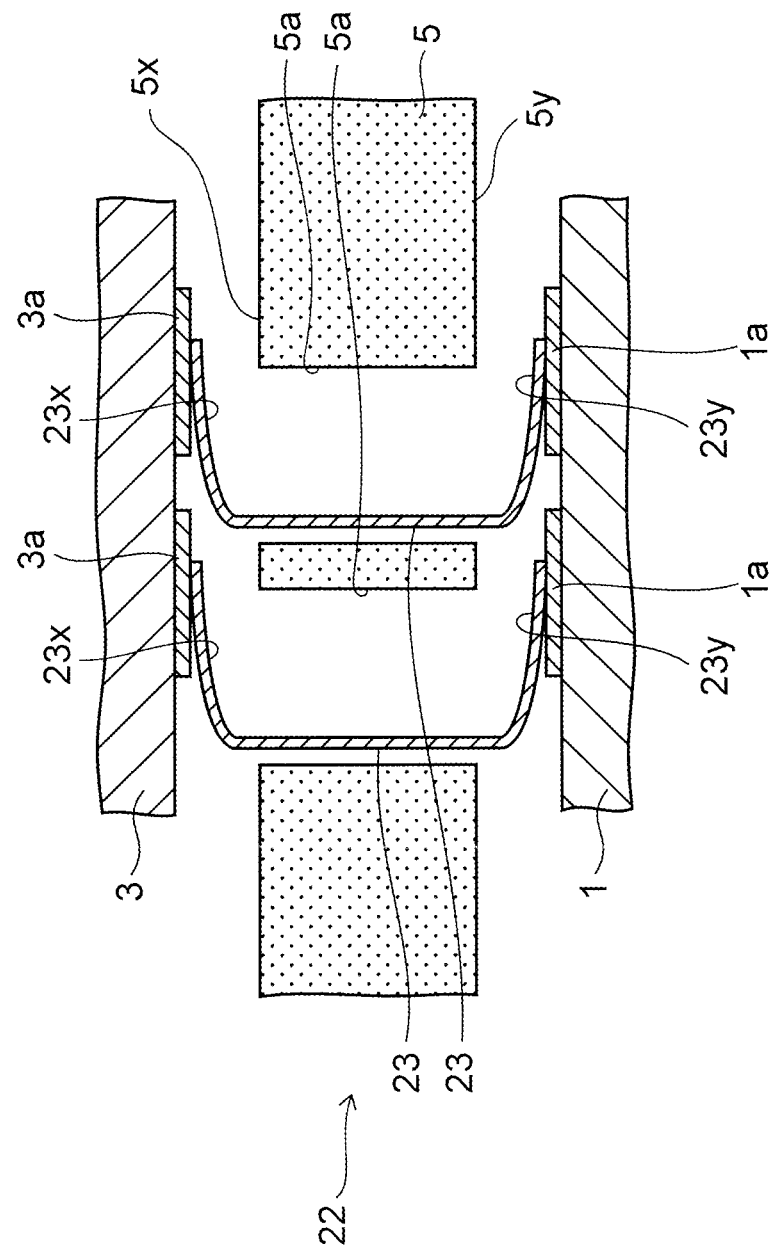
FIG. 7 is an enlarged cross-sectional view of terminals provided in the socket for semiconductor component according to the first embodiment and surroundings thereof.

FIG. 7 is an enlarged cross-sectional view of terminals 23 and their surroundings.

The insulator 5 has a first main surface 5x and a second main surface 5y, which are a top surface and a bottom surface of the insulator 5 respectively. One end 23x and another end 23y of each of the aforementioned terminals 23 protrude from the main surfaces 5x and 5y, respectively.

Moreover, similar to the example of FIG. 1, signal electrodes 1a and 3a are provided on the printed circuit board 1 and the semiconductor component 3, respectively.

The one end 23x of the terminal 23 comes in contact with the corresponding signal electrode 3a of the semiconductor component 3, and the another end 23y of the terminal 23 comes in contact with the corresponding signal electrode 1a of the printed circuit board 1. Thus, the signal electrodes 1a and 3a are electrically connected through the terminal 23.

Figure 8:
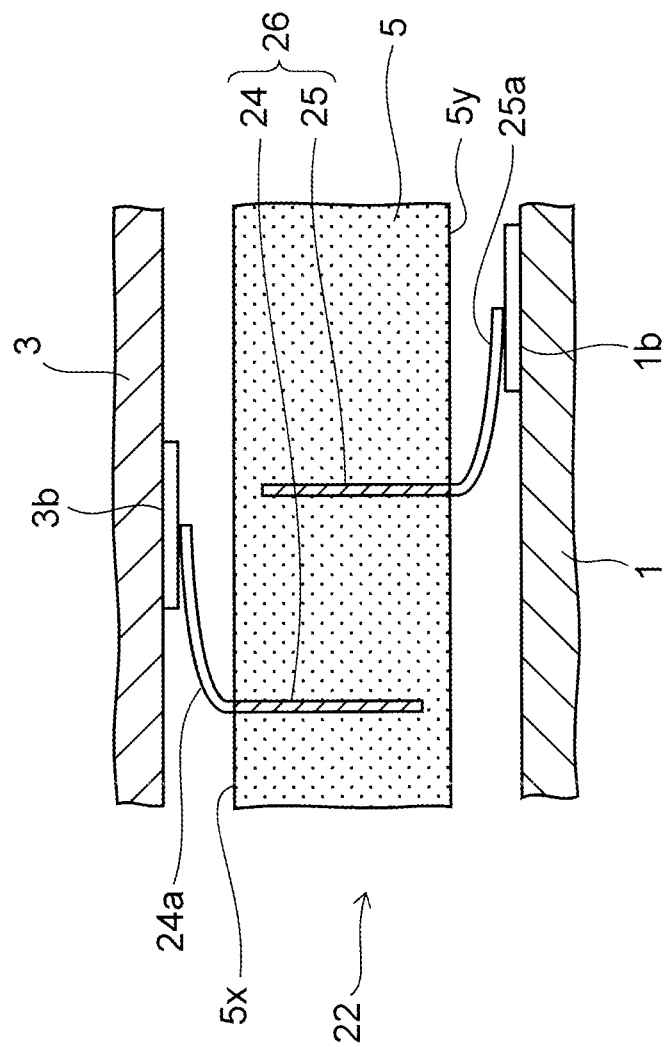
FIG. 8 is a partially cross-sectional side view which illustrates an insulator and surroundings thereof and which is taken along a cross section different from that of FIG. 7.

FIG. 8 is a partially cross-sectional side view which illustrates the insulator 5 and its surroundings and which is taken along a cross section different from that of FIG. 7.

As illustrated in FIG. 8, in addition to the aforementioned first shield plates 24, second shield plates 25 are buried in the insulator 5. These shield plates 24 and 25 constitute a shield 26.

In this example, the first shield plates 24 are buried from the one main surface 5x of the insulator 5 such that the first contacts 24a protrude from the main surface 5x. Further, the first contacts 24a are brought into contact with ground electrodes 3b of the semiconductor component 3 so that the first shield plates 24 is at the ground potential.

Meanwhile, the second shield plates 25 are buried in the insulator 5 from the other main surface 5y.

The second shield plates 25 have second contacts 25a, and the second contacts 25a are protruded from another main surface 5y. Further, the second contacts 25a are brought into contact with ground electrodes 1b of the printed circuit board 1 so that the second shield plates 25 is at the ground potential.

Figure 9:
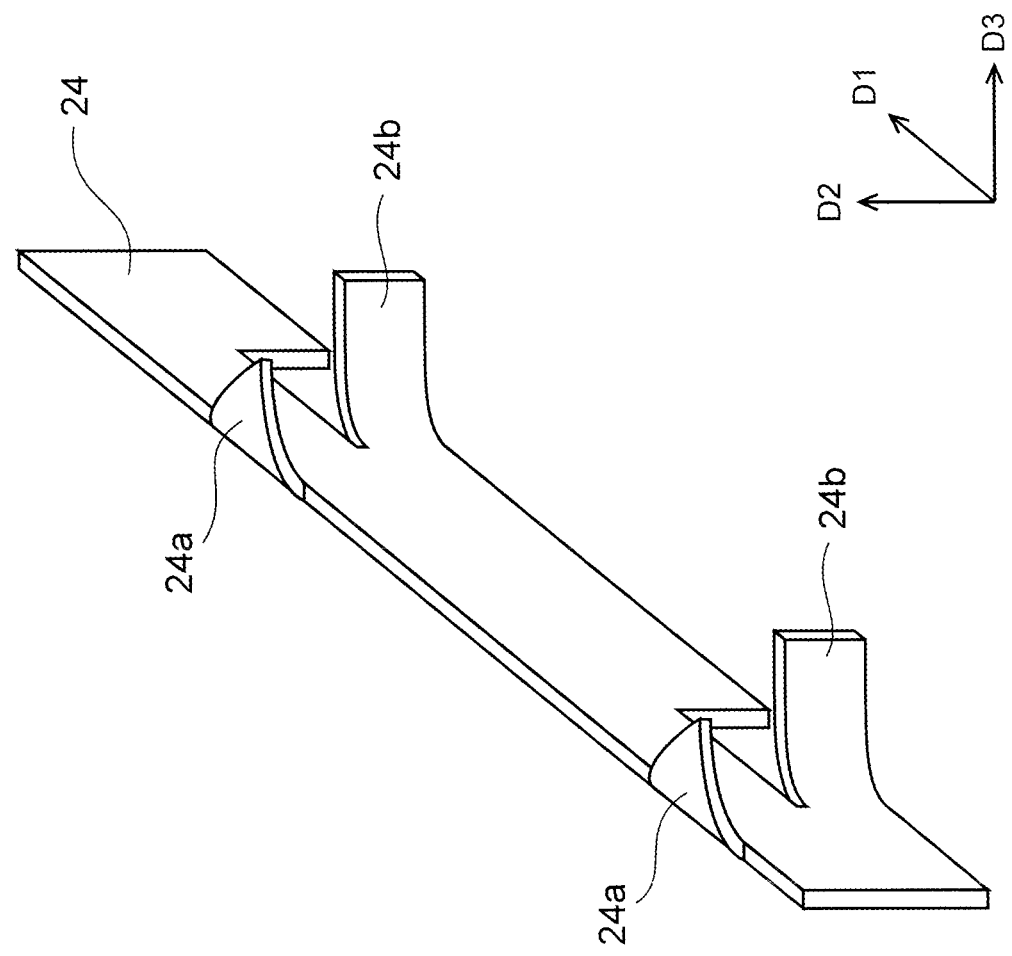
FIG. 9 is a perspective view of a first shield plate provided in the socket for semiconductor component according to the first embodiment.

FIG. 9 is a perspective view of the first shield plate 24.

The first shield plate 24 is formed by machining a long copper plate extending in its longitudinal direction D1. First bent portions 24b are provided in portions of the first shield plate 24.

Further, both the first bent portions 24b and the first contacts 24a are directed in a normal direction D3 of the first shield plate 24 by bending portions of the aforementioned copper plate. Bending the first contacts 24a in this way can give spring properties to the first contacts 24a, and this spring properties enable the first contacts 24a to be pressed against the ground electrodes 3b (see FIG. 8).

Figure 10:
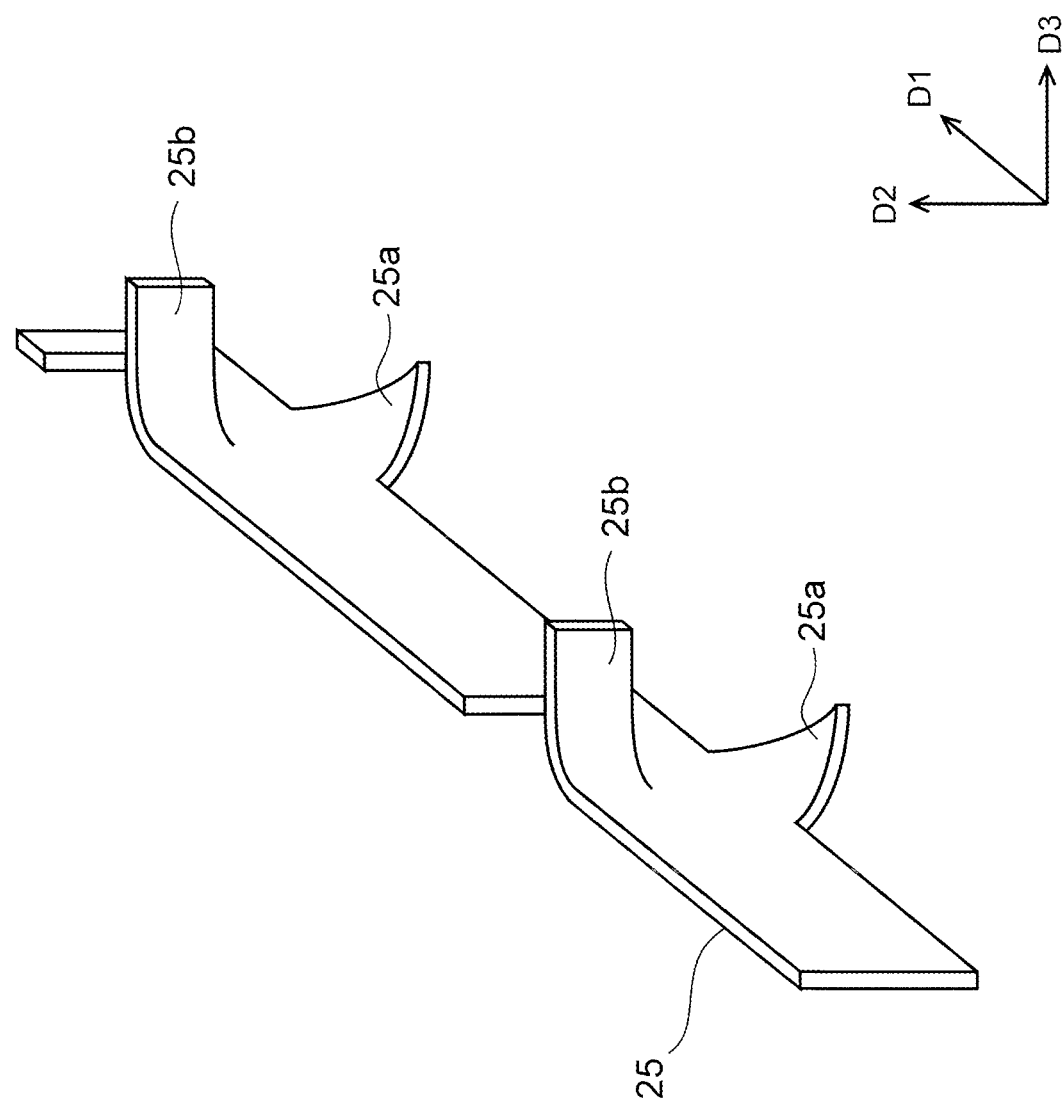
FIG. 10 is a perspective view of a second shield plate provided in the socket for semiconductor component according to the first embodiment.

FIG. 10 is a perspective view of the second shield plate 25.

Similar to the first shield plate 24, the second shield plate 25 is formed by machining a long copper plate extending in its longitudinal direction D1. Second bent portions 25b are provided in portions of the second shield plate 25.

Both the second bent portions 25b and the second contacts 25a are directed in the normal direction D3 of the second shield plate 25 by bending portions of the copper plate. This gives spring properties to the second contacts 25a as in the first contacts 24a, and this spring properties enable the second contacts 25a to be pressed against the ground electrodes 1b (see FIG. 8).

Figure 11:
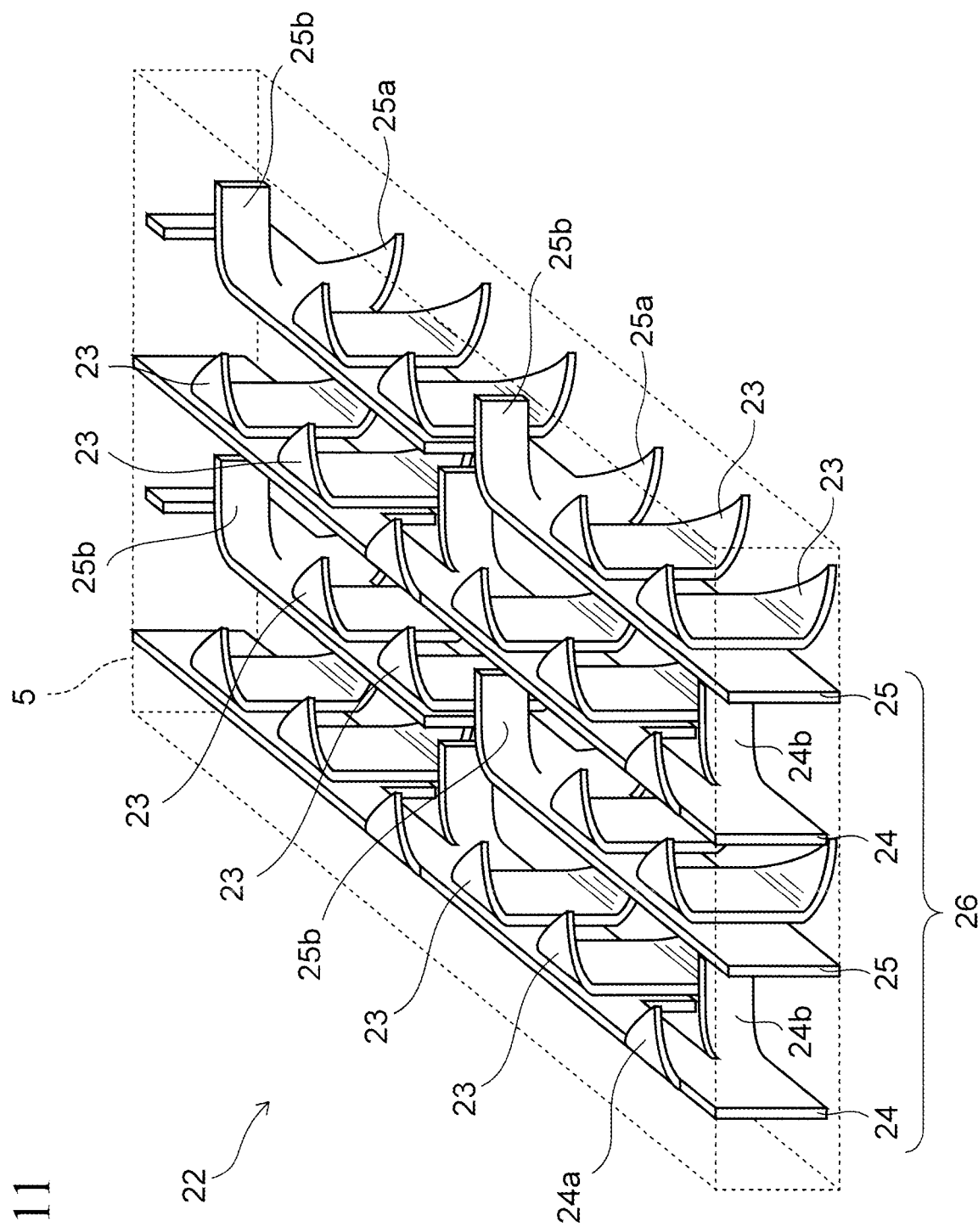
FIG. 11 is a schematic perspective view illustrating the positional relationship among terminals, first shield plates, and second shield plates in the first embodiment.

FIG. 11 is a schematic perspective view illustrating the positional relationship among the terminals 23, the first shield plates 24, and the second shield plates 25.

The first shield plates 24 and the second shield plates 25 are parallel to each other, and the terminals 23 are disposed therebetween. Further, the first bent portions 24b of the first shield plate 24 are directed toward an adjacent second shield plate 25, and the second bent portions 25b of the second shield plate 25 are directed toward an adjacent first shield plate 24.

Figure 12:
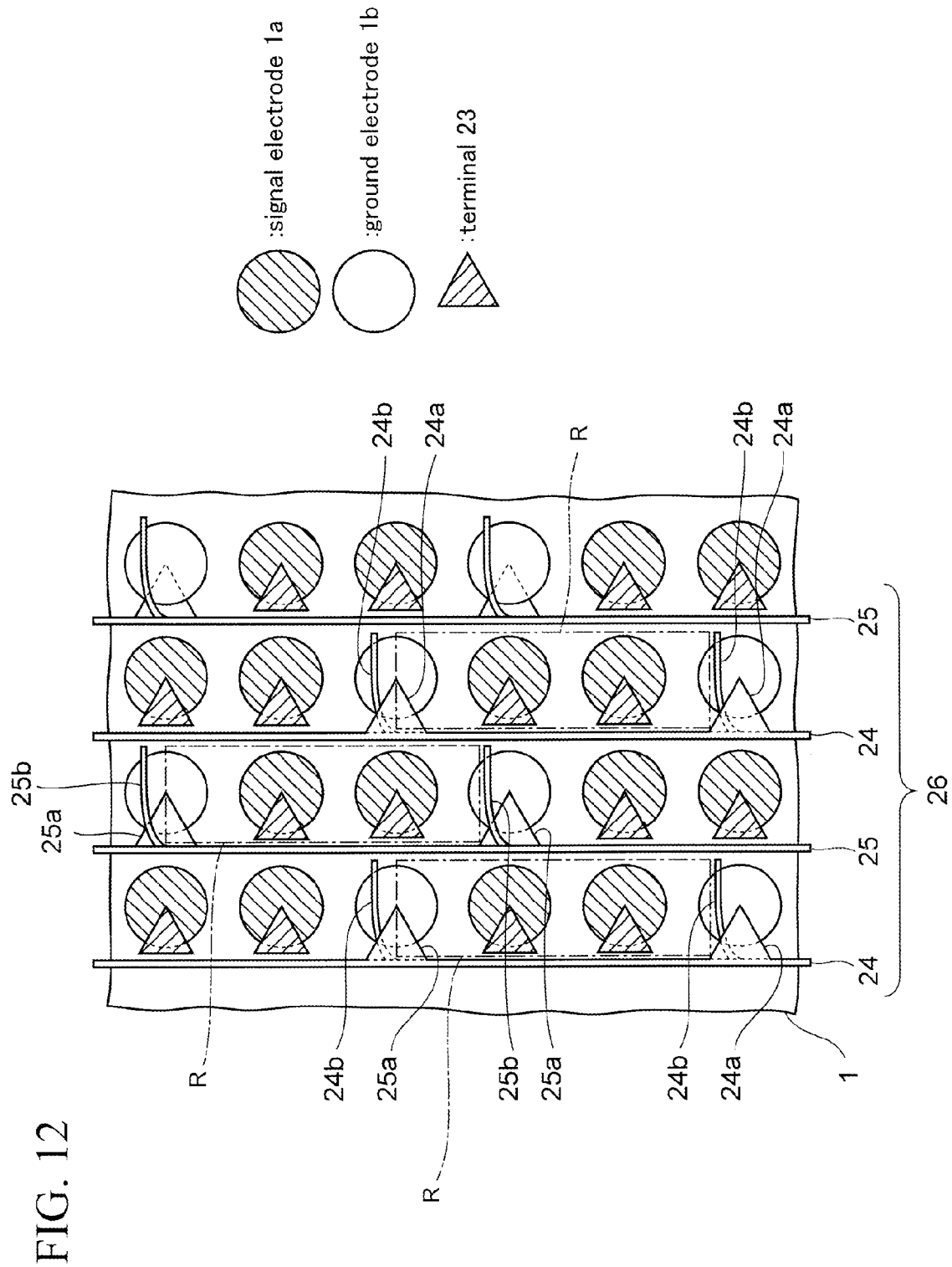
FIG. 12 is a plan view illustrating the arrangement of electrodes of a printed circuit board, terminals, the first shield plates, and the second shield plates in the first embodiment.

FIG. 12 is a plan view illustrating the arrangement of the electrodes 1a and 1b of the printed circuit board 1, the terminals 23, the first shield plates 24, and the second shield plates 25.

In this example, two signal electrodes 1a are provided in each partial region R of the printed circuit board 1, and these two signal electrodes 1 are used as the electrodes for differential signals.

In the partial region R, the terminal 23 on the signal electrodes 1a is surrounded by the adjacent shield plates 24 and 25 and the bent portions 24b and 25b from the sides of the terminal 23. Accordingly, the terminal 23 can be electromagnetically shielded with the shield 26.

Also, since the shield plates 24 and 25 are provided with the contacts 24a and 25a for grounding as described previously, these contacts 24a and 25a can be connected to the ground electrodes 1b and 3b of the printed circuit board 1 and the semiconductor component 3. Thus, the shield plates 24 and 25 are maintained at the ground potential. Accordingly, the fluctuation of the electric potentials of the shield plates 24 and 25 can be reduced, and the terminal 23 in the partial region R can be reliably shielded with the shield plates 24 and 25.

Moreover, in the semiconductor component 3 such as a CPU or the like, since differential signals having a high resistant to noise are frequently employed, the practical benefit of shielding the signal electrodes 1a for differential signals with the shield plates 24 and 25 is particularly high.

Further, since the signal electrodes 3a do not need to be surrounded by a plurality of ground electrodes 3b in order to shield the terminals 23 as in the example of FIG. 3, a large number of signal electrodes 1a and 3a can be disposed on the printed circuit board 1 and the semiconductor component 3.

For example, in the example of FIG. 3, shielding two signal electrodes 3a for differential signals requires a space corresponding to twelve electrodes in total, including ten ground electrodes 3b around the two signal electrodes 3a. Meanwhile, in the present embodiment, the shield 26 can be grounded through two ground electrodes 1b at two opposite ends of the partial region R as illustrated in FIG. 12, and shielding two signal electrodes 3a for differential signals requires a space corresponding to only four electrodes.

Next, a method of manufacturing the socket 22 for the semiconductor component according to the present embodiment will be described.

Figure 13:
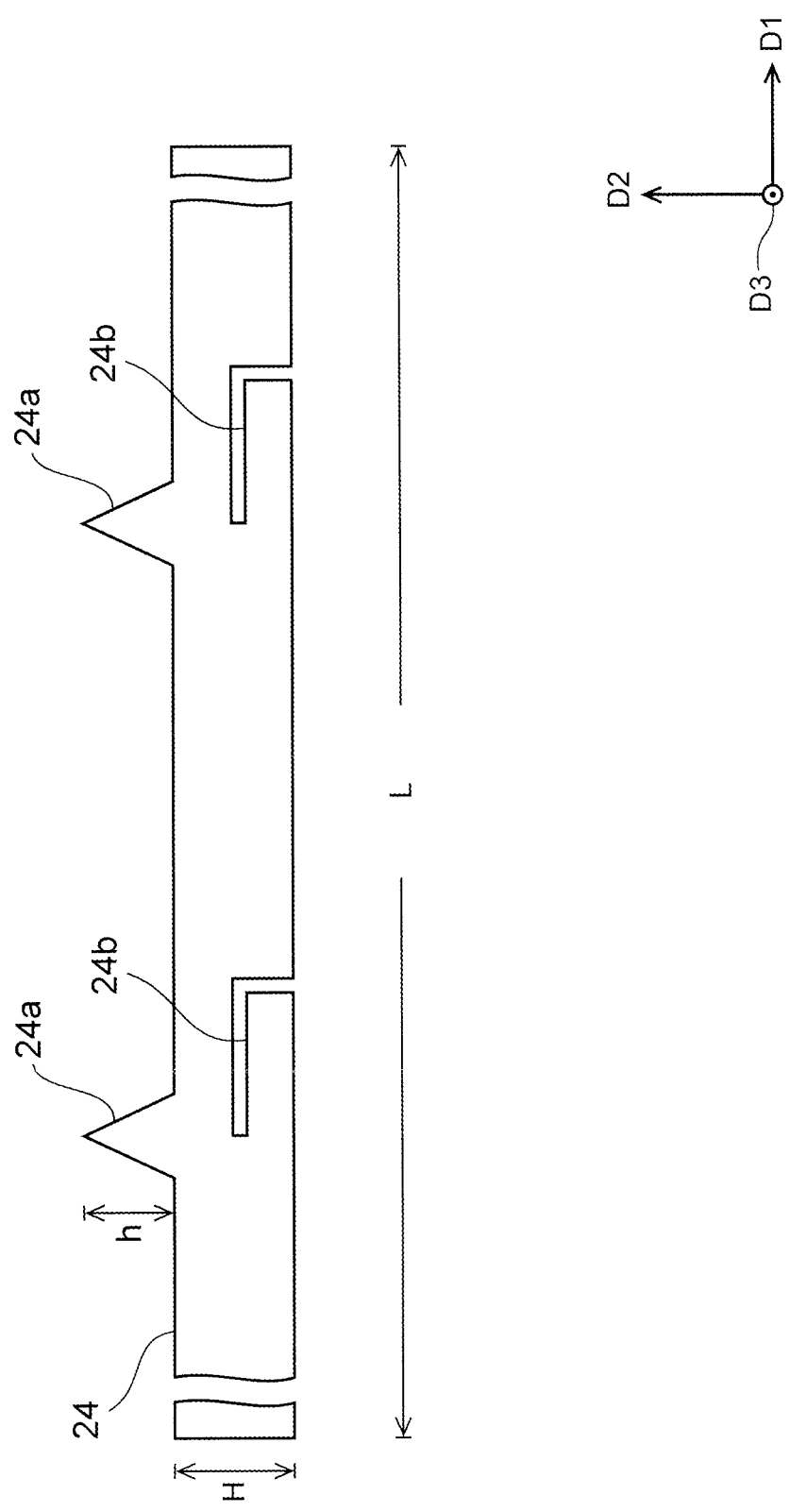
FIG. 13 is a plan view of the socket for semiconductor component in the course of manufacturing thereof according to the first embodiment.

FIG. 13 is a plan view of the socket 22 for the semiconductor component in the course of manufacturing thereof. Moreover, FIGS. 14A to 14E are perspective views of the socket 22 for the semiconductor component in the course of manufacturing thereof.

First, as illustrated in FIG. 13, a copper plate is machined to fabricate the first shield plate 24 including first protrusions 24a and the first bent portions 24b.

Dimensions of the shield plate 24 are not particularly limited. In this example, a length L of the first shield plate 24 measured in the longitudinal direction D1 of the first shield plate 24 is approximately 30 mm, a height H thereof is approximately 1 mm, and a height h of the protrusion 24a is approximately 0.5 mm. Moreover, a thickness of the first shield plate 24 is approximately 20 μm.

Figure 14A:
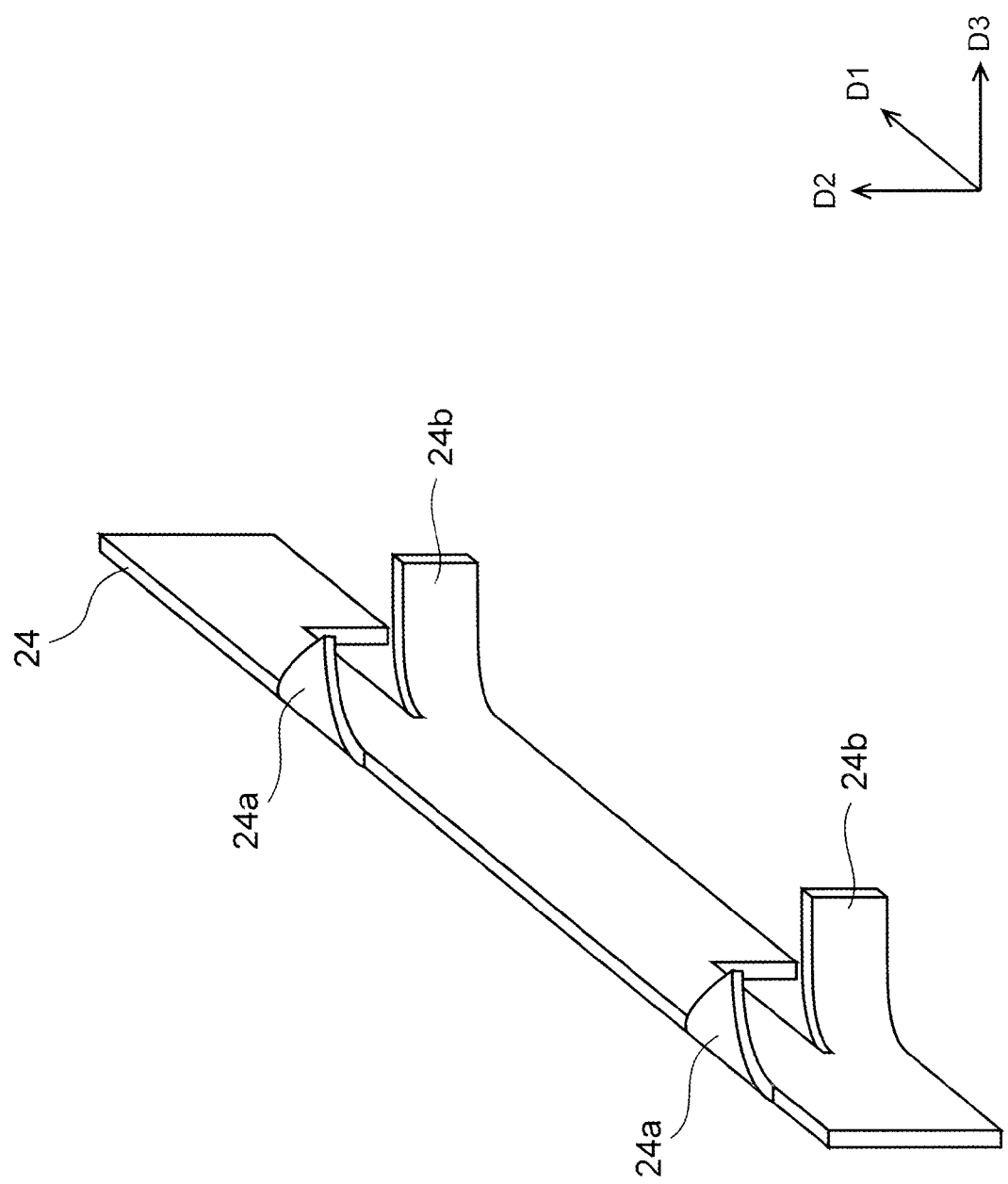
FIGS. 14A to 14E are perspective views of the socket for semiconductor component in the course of manufacturing thereof according to the first embodiment.

Next, as illustrated in FIG. 14A, the first protrusions 24a and the first bent portions 24b are bent by machining. Thus, both the first protrusions 24a and the first bent portions 24b are directed in the normal direction D3 of the first shield plate 24.

It should be noted that instead of performing this step, the protrusions 24a and the bent portions 24b may be bent at the same time as the fabrication of the first shield plate 24 in the step of FIG. 13.

Figure 14B:
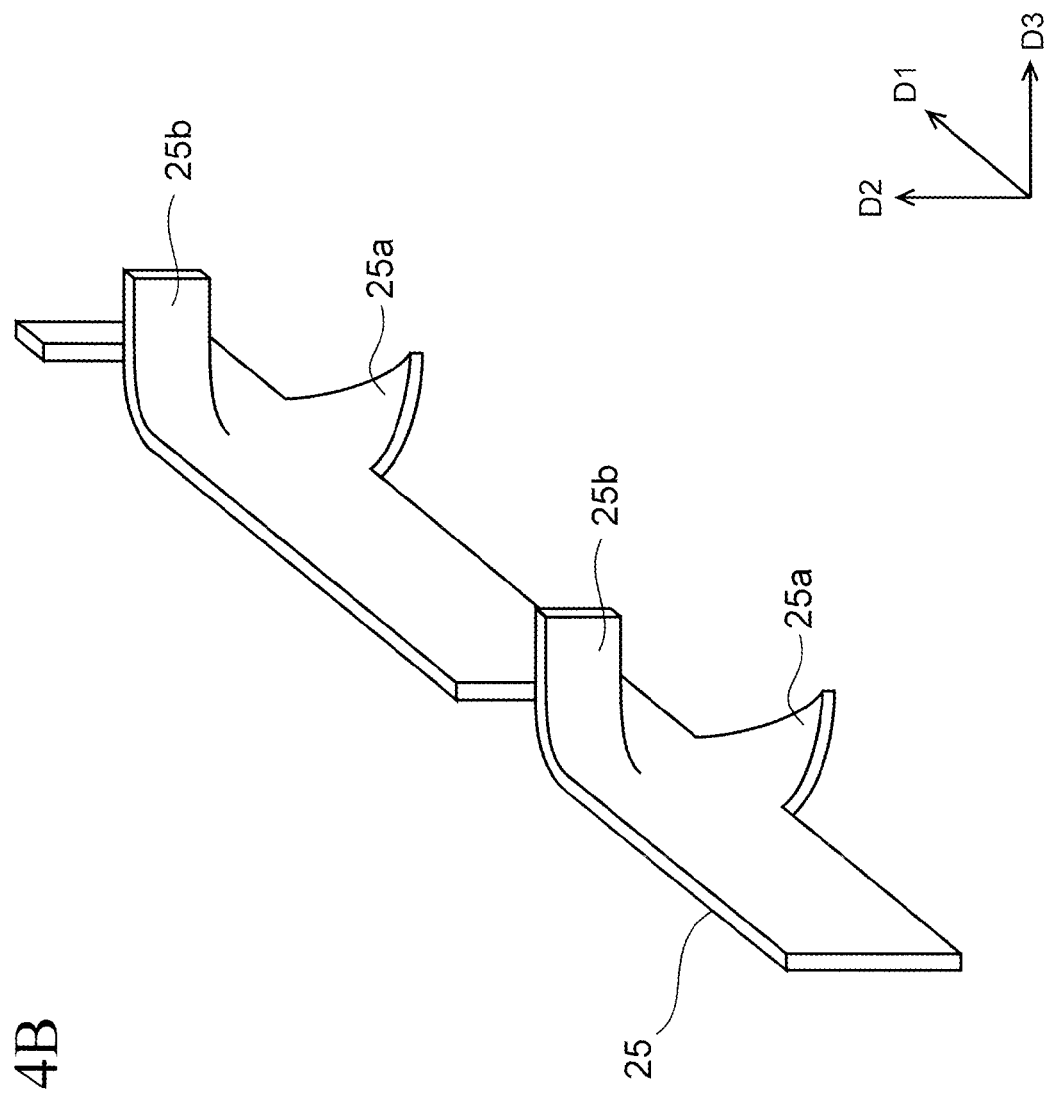

Then, as illustrated in FIG. 14B, the second shield plate 25 is fabricated by a machining method similar to that used for the aforementioned first shield plate 24. It should be noted that dimensions of the second shield plate 25 are the same as the aforementioned ones of the first shield plate 24, and will not be described here.

Figure 14C:
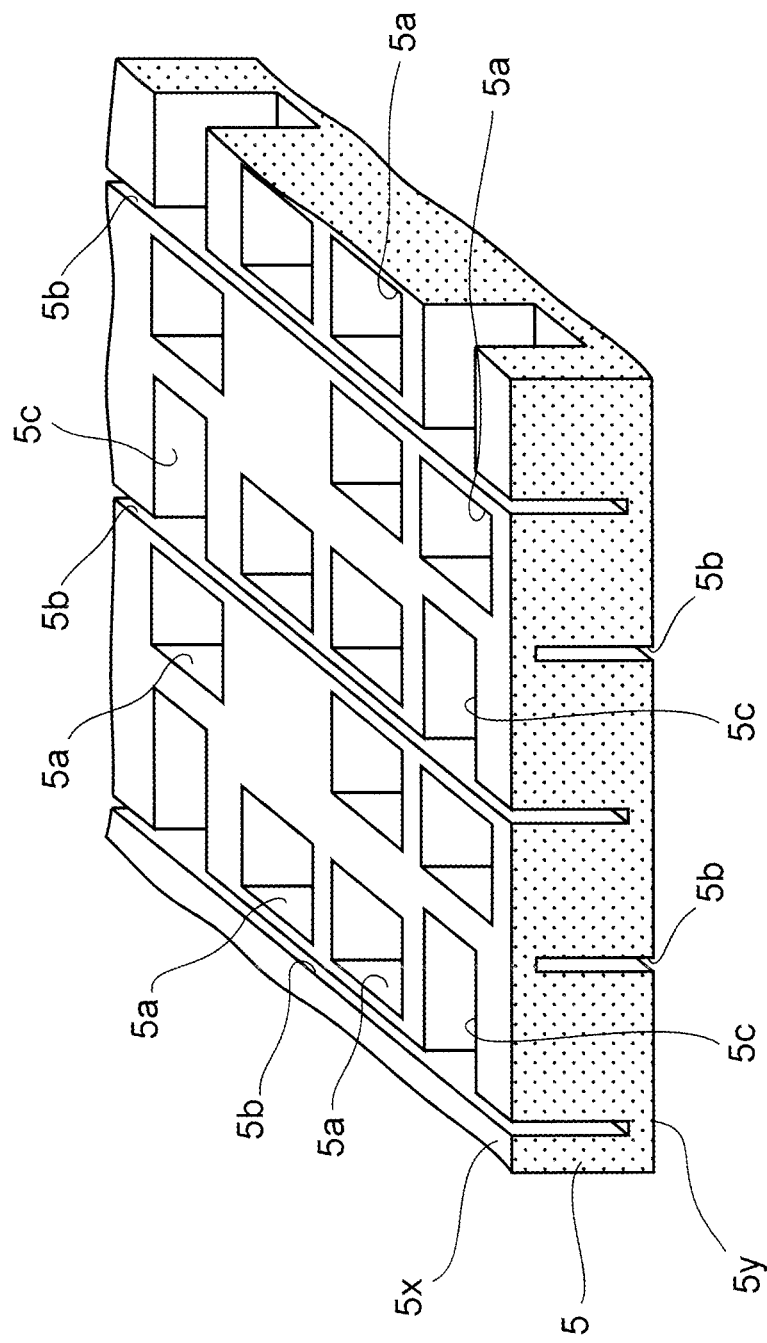

Subsequently, as illustrated in FIG. 14C, the insulator 5 is prepared. Then, through holes 5a, grooves 5b, and recessed portions 5c are formed in the insulator 5.

Among these, the through holes 5a are formed to pass through the insulator 5 from one main surface 5x thereof to another main surface 5y thereof.

On the other hand, each of the grooves 5b is formed from one of the main surfaces 5x and 5y to an intermediate depth of the insulator 5.

Further, the recessed portions 5c are formed to communicate with the grooves 5b.

It should be noted that the through holes 5a, the grooves 5b, and the recessed portions 5c may be formed in the insulator 5 by machining, or may by formed by injection molding or the like at the same time as the molding of the insulator 5.

Figure 14D:
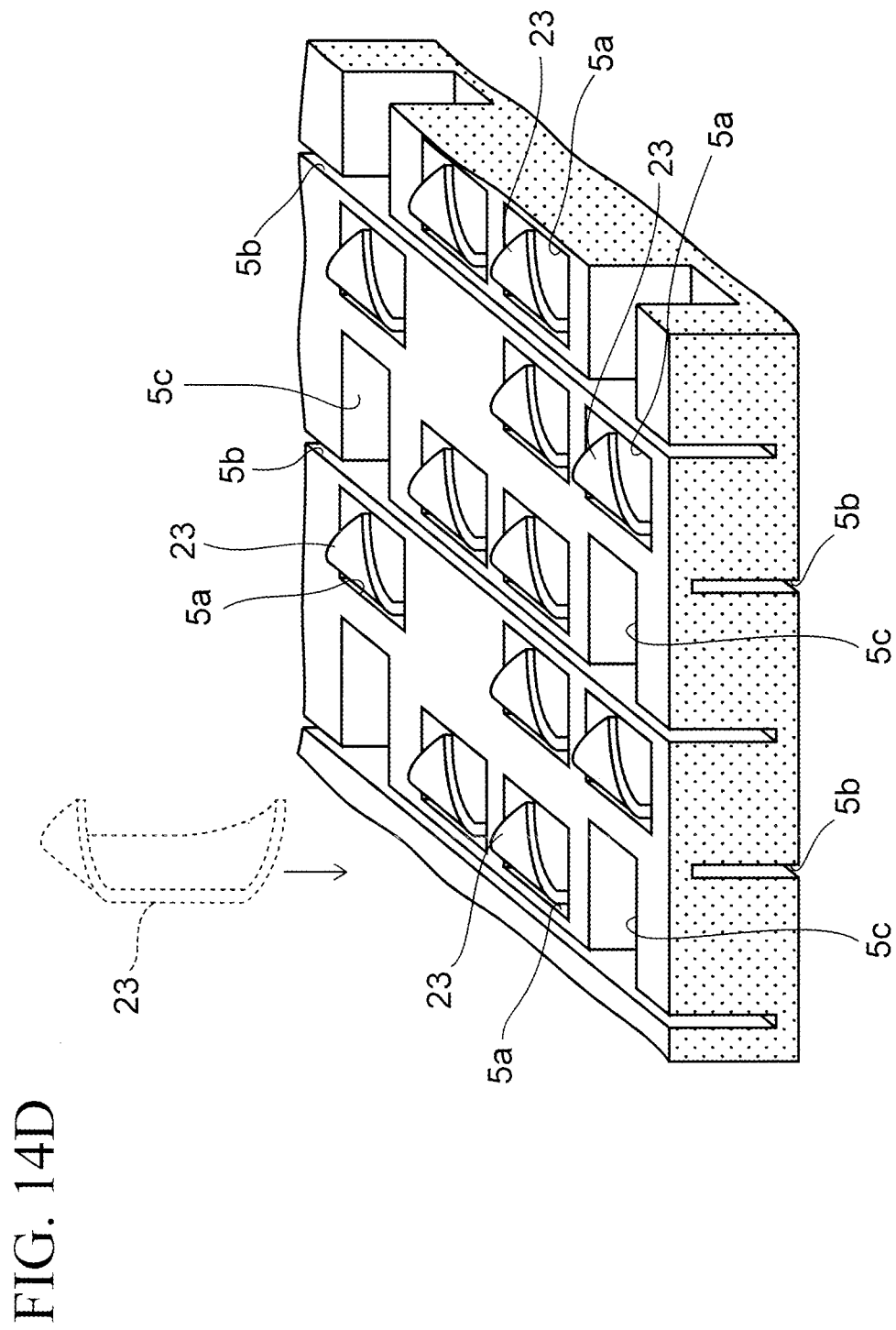

Further, as illustrated in FIG. 14D, the terminals 23 are inserted into the through holes 5a of the insulator 5.

Figure 14E:
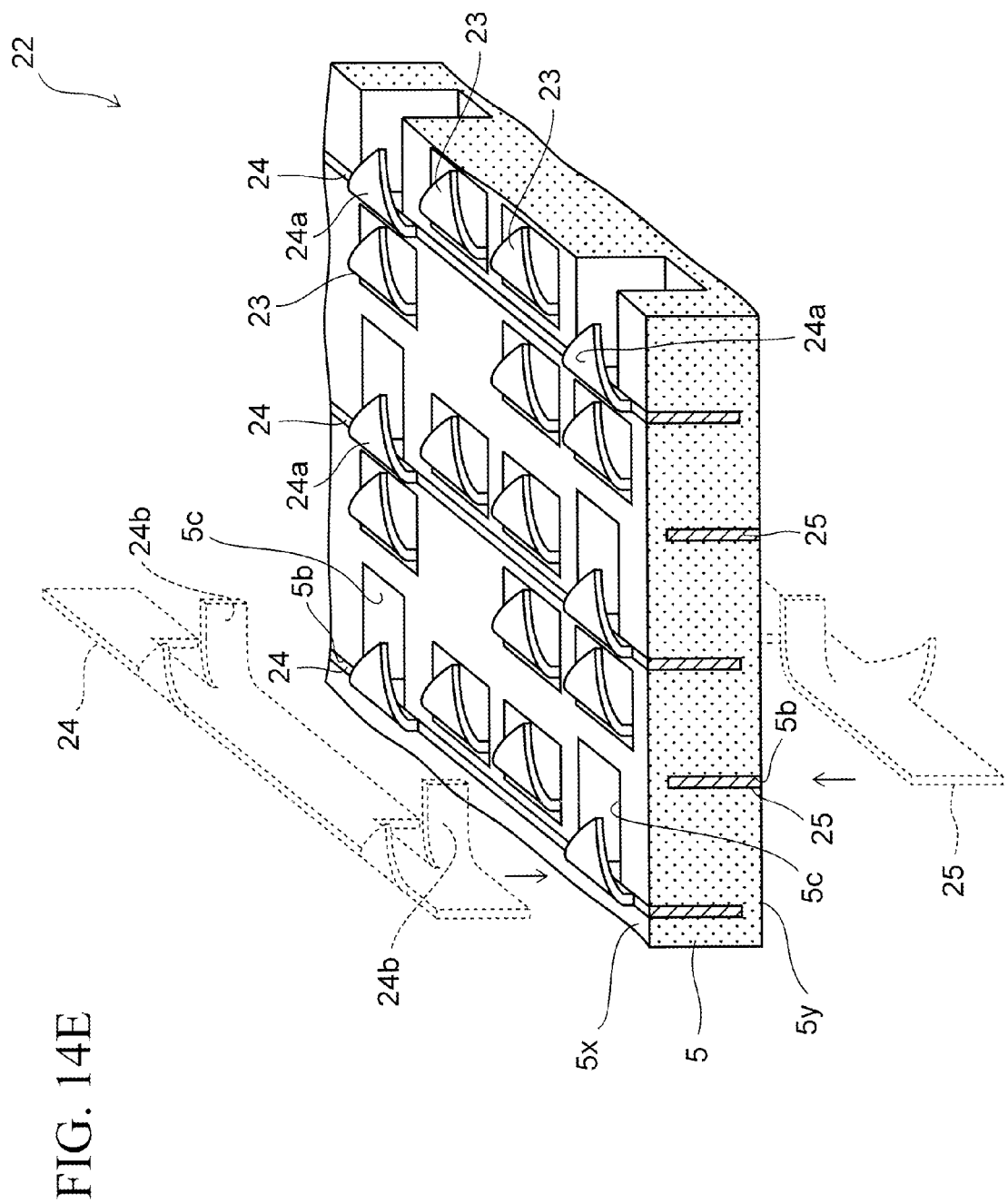

Then, as illustrated in FIG. 14E, the first shield plates 24 are pressed into the grooves 5b from the one main surface 5x of the insulator 5, and the second shield plates 25 are pressed into the grooves 5b from another main surface 5y.

It should be noted that the first bent portions 24b of the shield plates 24 are fitted into the recessed portions 5c of the insulator 5.

By the above described process, a basic structure of the socket 22 for the semiconductor component according to the present embodiment is obtained.

According to the above described method of manufacturing the socket 22 for the semiconductor component, the shield plates 24 and 25 are pressed into the grooves 5b of the insulator 5 in the step of FIG. 14E to bury these shield plates 24 and 25 in the insulator 5.

Burying the shield plates 24 and 25 by pressing can reduce the cost of the socket 22 for the semiconductor component compared to burying by insert molding, which requires mold cost.

While the present embodiment has been described above, the present embodiment is not limited by the above description.

For example, although the shield 26 is formed of the first shield plate 24 and the second shield plate 25 in the example of FIG. 12, the shield 26 may be formed only by the first shield plates 24 as described below.

Figure 15:
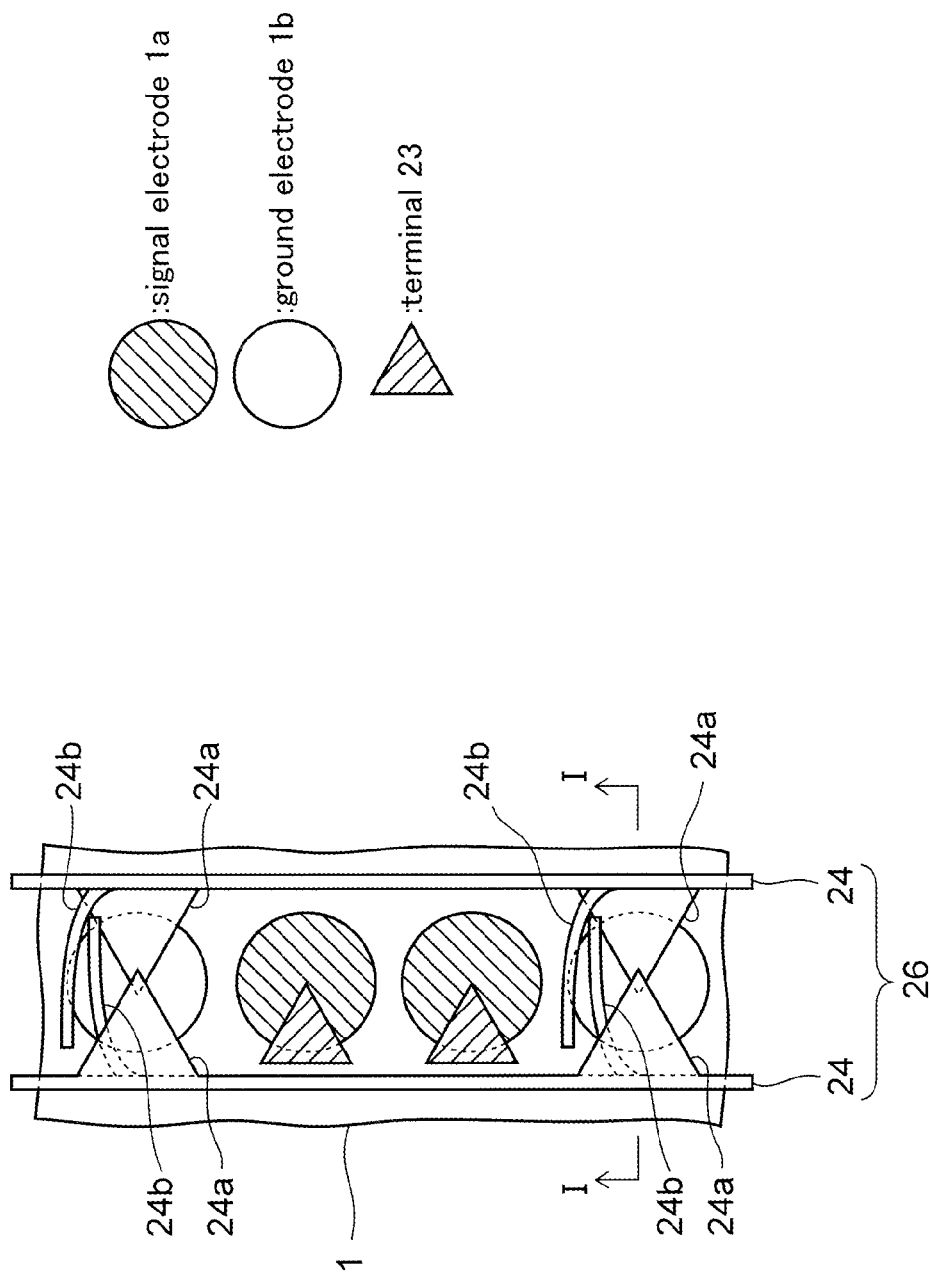
FIG. 15 is a plan view illustrating the arrangement of electrodes of the printed circuit board, terminals, and first shield plates for the case where a shield is formed only by first shield plates in the first embodiment.

FIG. 15 is a plan view illustrating the arrangement of the electrodes 1a and 1b of the printed circuit board 1, the terminals 23, and the first shield plates 24 for the case where the shield 26 is formed only by the first shield plates 24 as described above.

In this example, one of the two adjacent first shield plates 24 is inverted to the other one, and the first bent portions 24b of these first shield plates 24 are overlapped.

This provides a structure in which the signal electrodes 1a are surrounded by two adjacent first shield plates 24 and their first bent portions 24b, and the signal electrodes 1a can be electromagnetically shielded with the shield 26.

Figure 16:
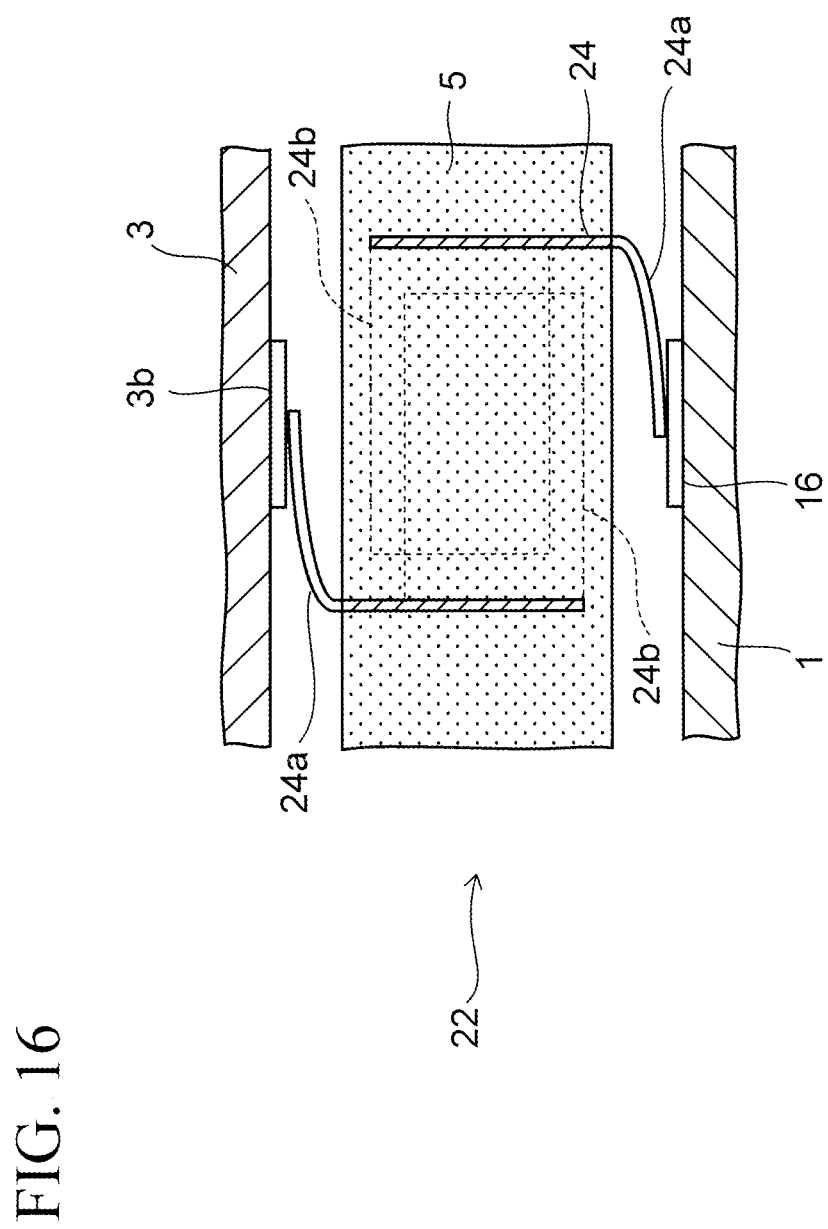
FIG. 16 is a partially cross-sectional side view taken along line I-I of FIG. 15.

FIG. 16 is a partially cross-sectional side view taken along line I-I of FIG. 15.

As illustrated in FIG. 16, the two adjacent first shield plates 24 are vertically inverted to each other, and the first contacts 24a of the first shield plates 24 come in contact with the ground electrodes 3b of the semiconductor component 3.

Second Embodiment

In the first embodiment, the socket 22 for the semiconductor component is attachable to and detachable from the printed circuit board 1 as described with reference to FIG. 5.

Meanwhile, in the present embodiment, the socket 22 for the semiconductor component is fixed to the printed circuit board 1 as described below.

Figure 17:
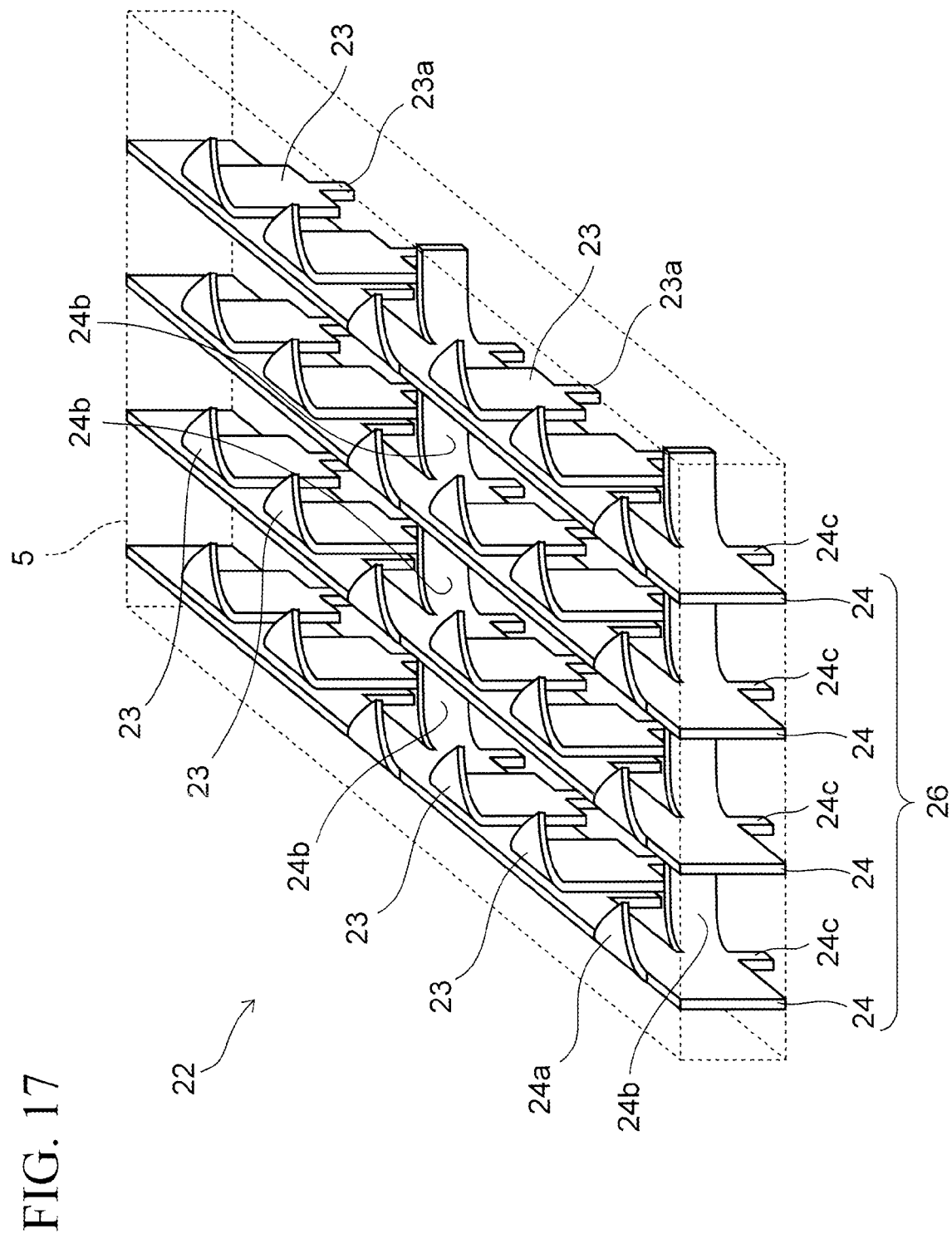
FIG. 17 is a schematic perspective view of a socket for semiconductor component according to a second embodiment.

FIG. 17 is a schematic perspective view of the socket for the semiconductor component according to the present embodiment.

It should be noted that in FIG. 17, the same components as those described in the first embodiment are denoted by the same reference numerals as those in the first embodiment, and will not be further described below. This is also the case for FIGS. 18 to 21 described below.

As illustrated in FIG. 17, in the socket 22 for the semiconductor component according to the present embodiment, the shield 26 is formed of a plurality of first shield plates 24, and the terminals 23 are surrounded by the first shield plates 24 and their first bent portions 24b. Accordingly, the terminals 23 can be electromagnetically shielded with the shield 26 as in the first embodiment.

Moreover, in the present embodiment, the second contacts 24c are provided in the lower portions of the first shield plates 24. The second contacts 24c have the shape of a rectangular strip, and protrude from the bottom surface of the insulator 5.

Further, first protrusions 23a each having the shape of a rectangular strip are provided at lower ends of the terminals 23. The first protrusions 23a protrude from the bottom surface of the insulator 5.

Figure 18:
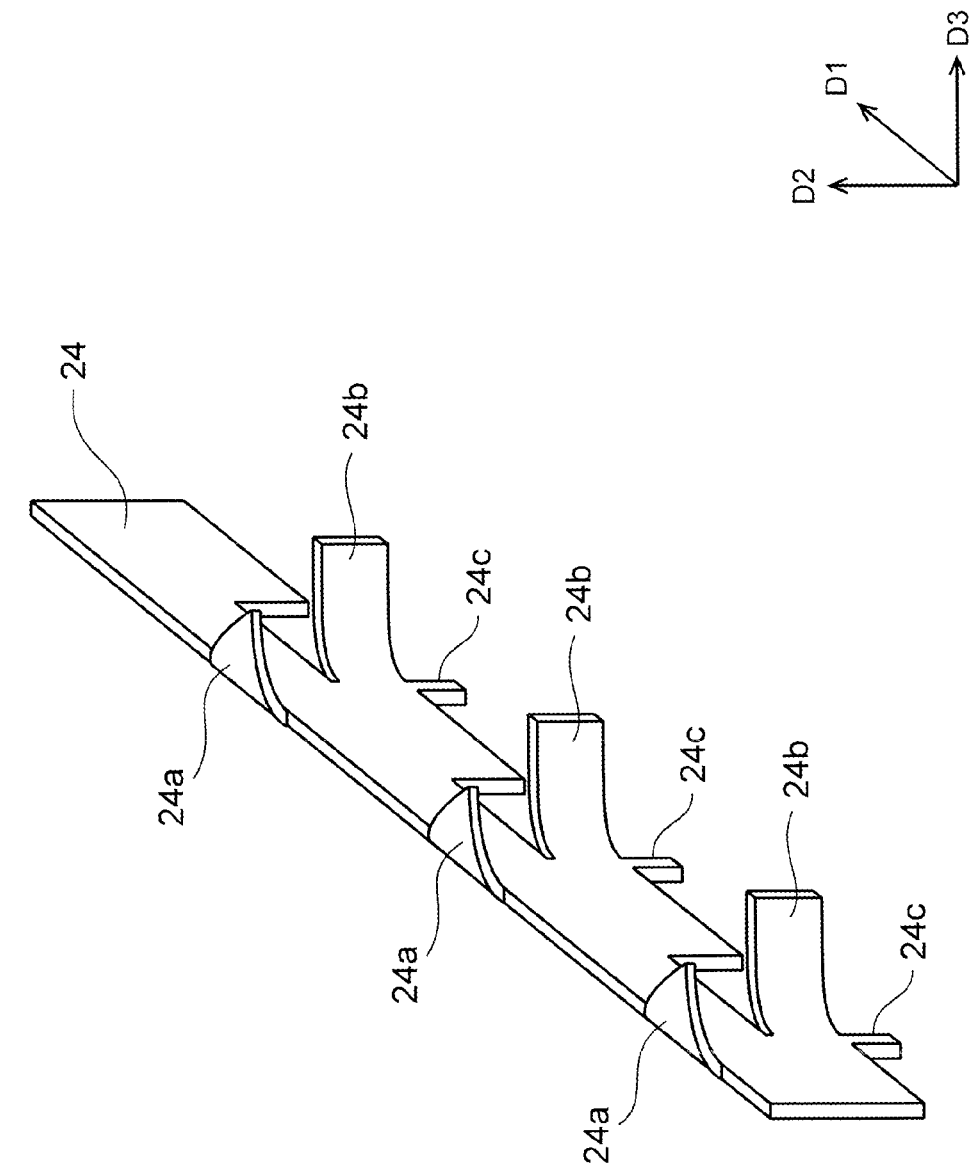
FIG. 18 is a perspective view of a first shield plate provided in the socket for semiconductor component according to the second embodiment.
Figure 19:
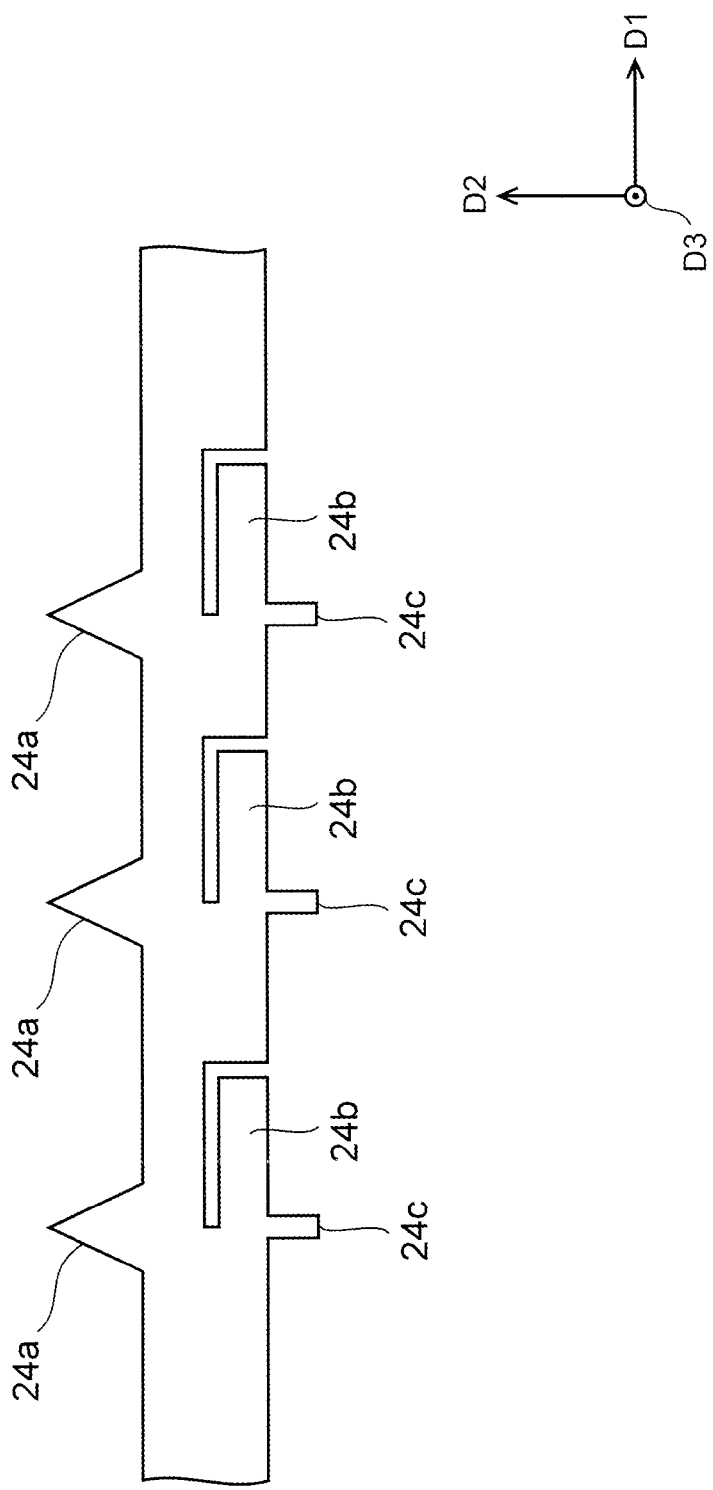
FIG. 19 is a developed view of the first shield plate provided in the socket for semiconductor component according to the second embodiment.

FIG. 18 is a perspective view of the first shield plate 24 according to the present embodiment, and FIG. 19 is a developed view of the first shield plate 24.

As illustrated in FIGS. 18 and 19, the first shield plate 24 can be fabricated by machining a long copper plate extending in its longitudinal direction D1. Further, the first contacts 24a, the first bent portions 24b, and the second contacts 24c are provided integrally with the copper plate.

Figure 20:
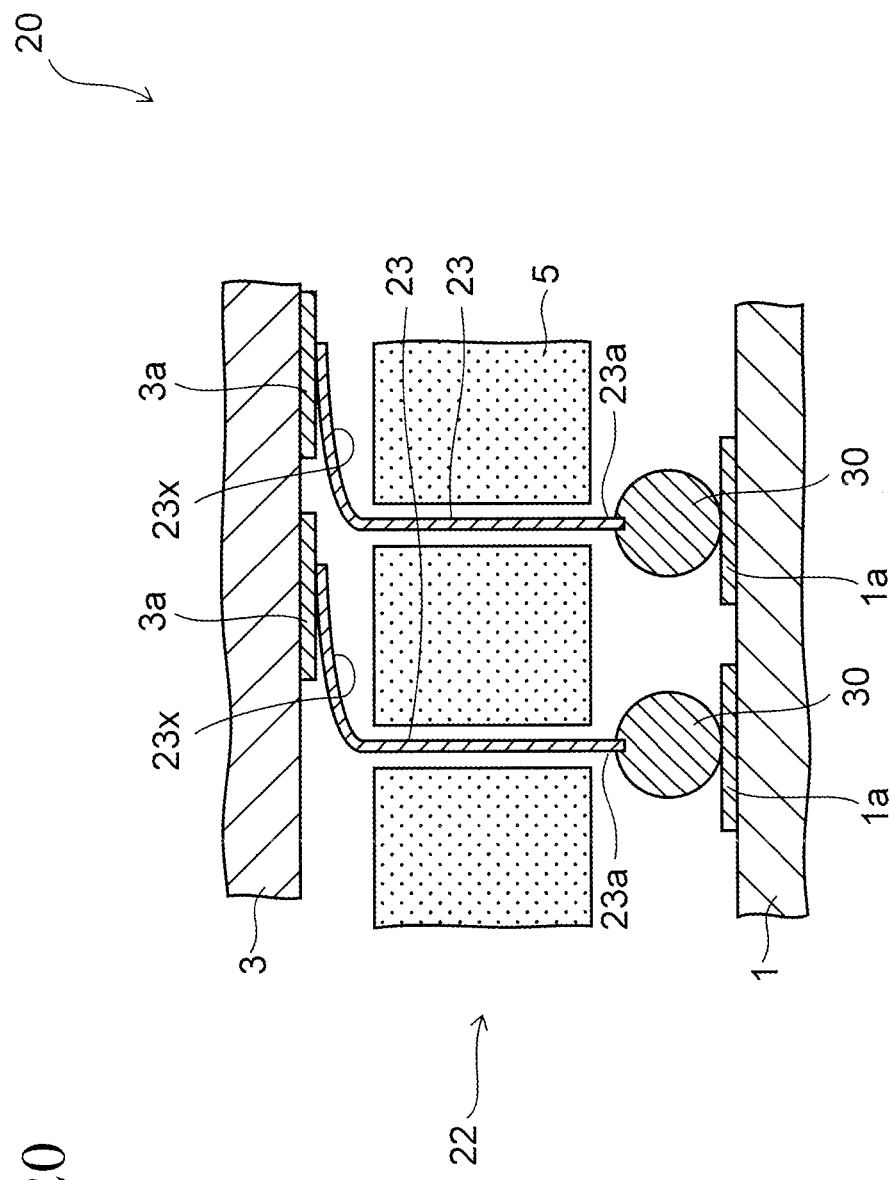
FIG. 20 is an enlarged cross-sectional view of an information processing apparatus including the socket for semiconductor component according to the second embodiment.

FIG. 20 is an enlarged cross-sectional view of an information processing apparatus 20 including this socket 22 for the semiconductor component.

As illustrated in FIG. 20, solder bumps 30 are fixed to the first protrusions 23a of the terminals 23. Further, the terminals 23 are fixed to the signal electrodes 1a of the printed circuit board 1 with the solder bumps 30.

It should be noted that the signal electrodes 3a of the semiconductor component 3 are merely in contact with the one ends 23x of the terminals 23, and the semiconductor component 3 is attachable to and detachable from the socket 22.

Figure 21:
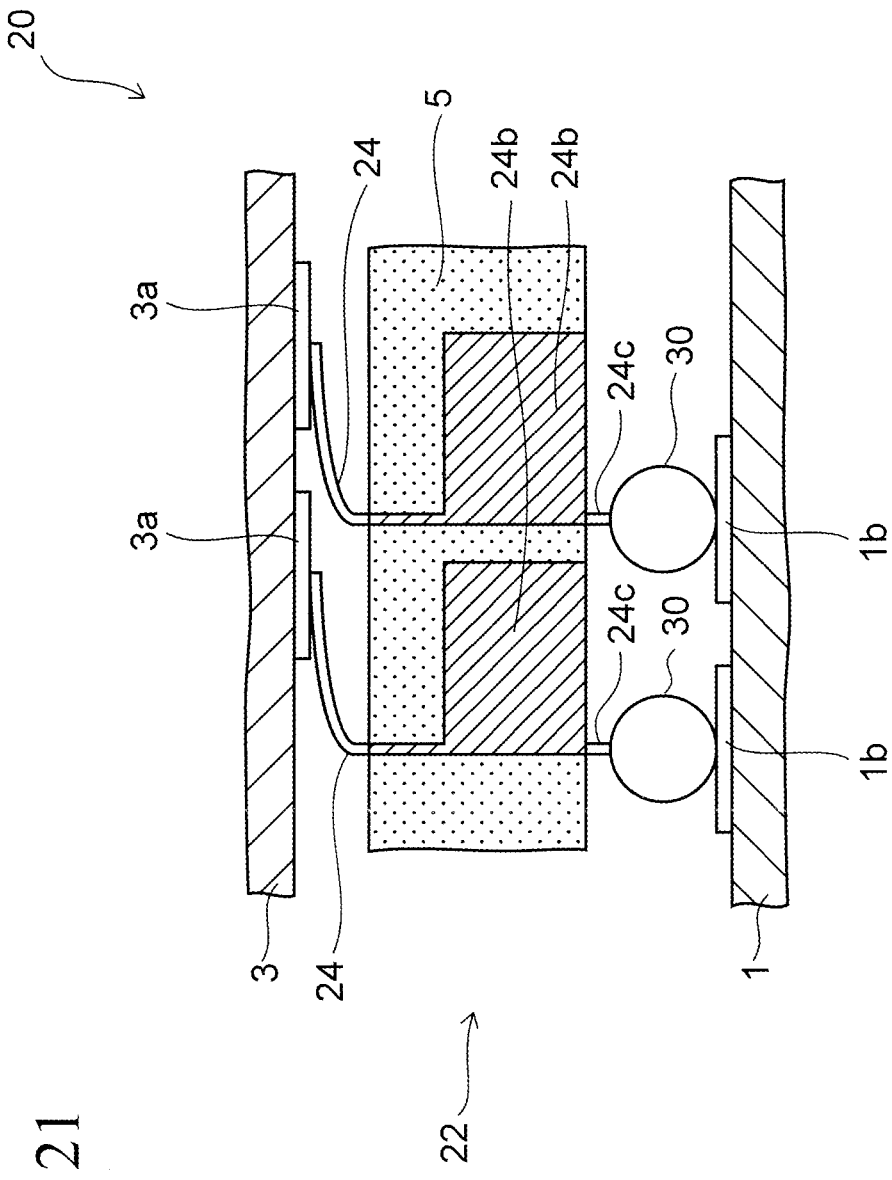
FIG. 21 is a partially cross-sectional side view which illustrates an insulator and surroundings thereof and which is taken along a cross section different from that of FIG. 20.

FIG. 21 is a partially cross-sectional side view which illustrates the insulator 5 and its surroundings, which is taken along a cross section different from that of FIG. 20.

As illustrated in FIG. 21, solder bumps 30 are also fixed to the second contacts 24c of the first shield plate 24. Further, the first shield plates 24 are fixed to the ground electrodes 1b of the printed circuit board 1 with the solder bumps 30.

The socket 22 fixed to the printed circuit board 1 with the solder bumps 30 as illustrated in FIGS. 20 and 21 is also called a BGA-type socket.

According to the BGA-type socket 22, since the first shield plates 24 are fixed to the ground electrodes 1b with the solder bumps 30, the first shield plates 24 can be reliably grounded through the ground electrodes 1b, and the fluctuation of the electric potentials of the first shield plates 24 can be reliably reduced.

Third Embodiment

In the present embodiment, the first shield plates 24 are more reliably maintained at the ground potential as described below.

Figure 22:
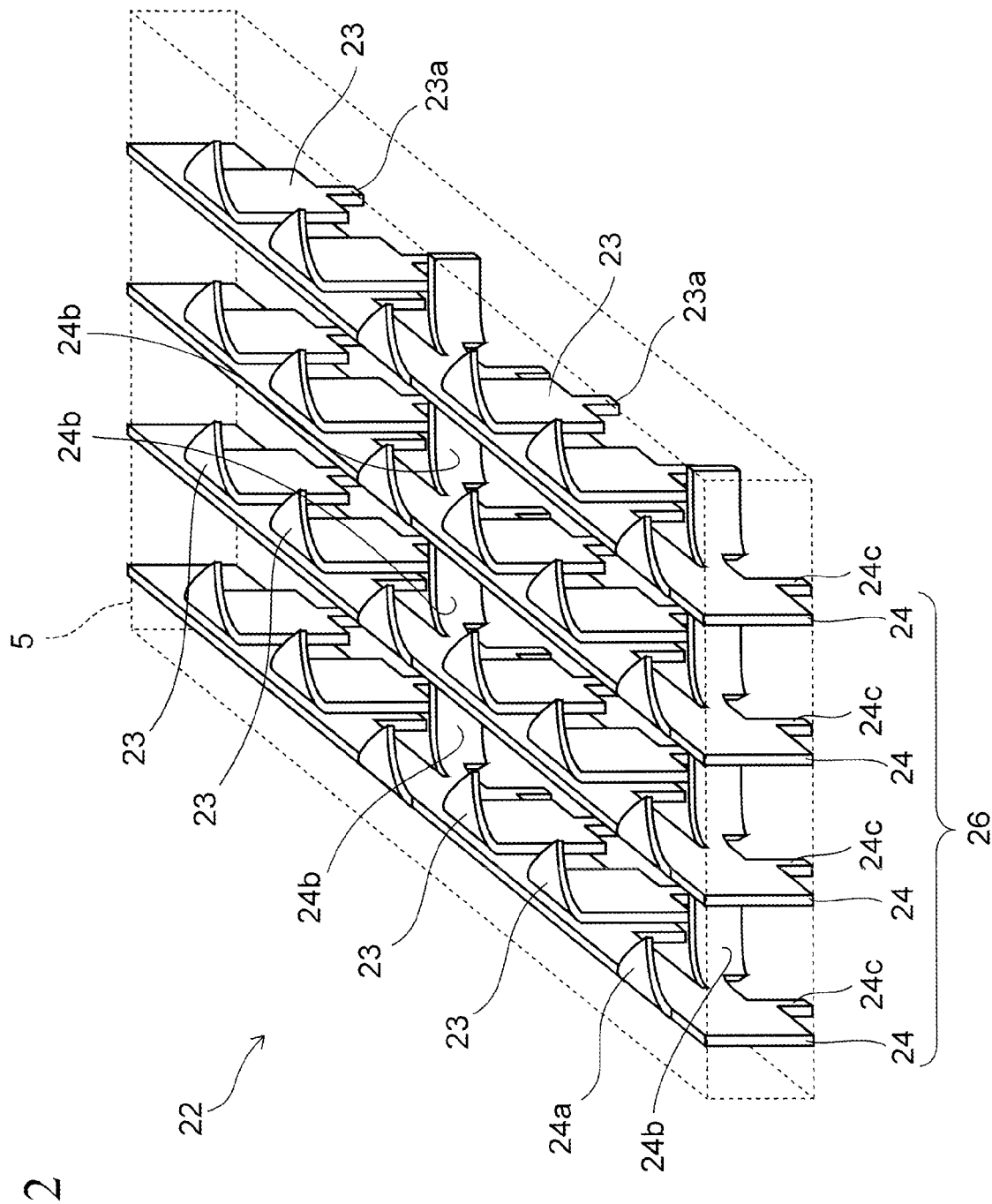
FIG. 22 is a schematic perspective view of a socket for semiconductor component according to a third embodiment.

FIG. 22 is a schematic perspective view of a socket for the semiconductor component according to the present embodiment.

It should be noted that in FIG. 22, the same components as those described in the first and second embodiments are denoted by the same reference numerals as those in these embodiments, and will not be further described below. This is also the case for FIGS. 22 to 25 described below.

As illustrated in FIG. 22, in the socket 22 for the semiconductor component according to the present embodiment, the shield 26 is formed of a plurality of first shield plates 24, and the terminals 23 are electromagnetically shielded with the shield 26, as in the second embodiment.

Figure 23:
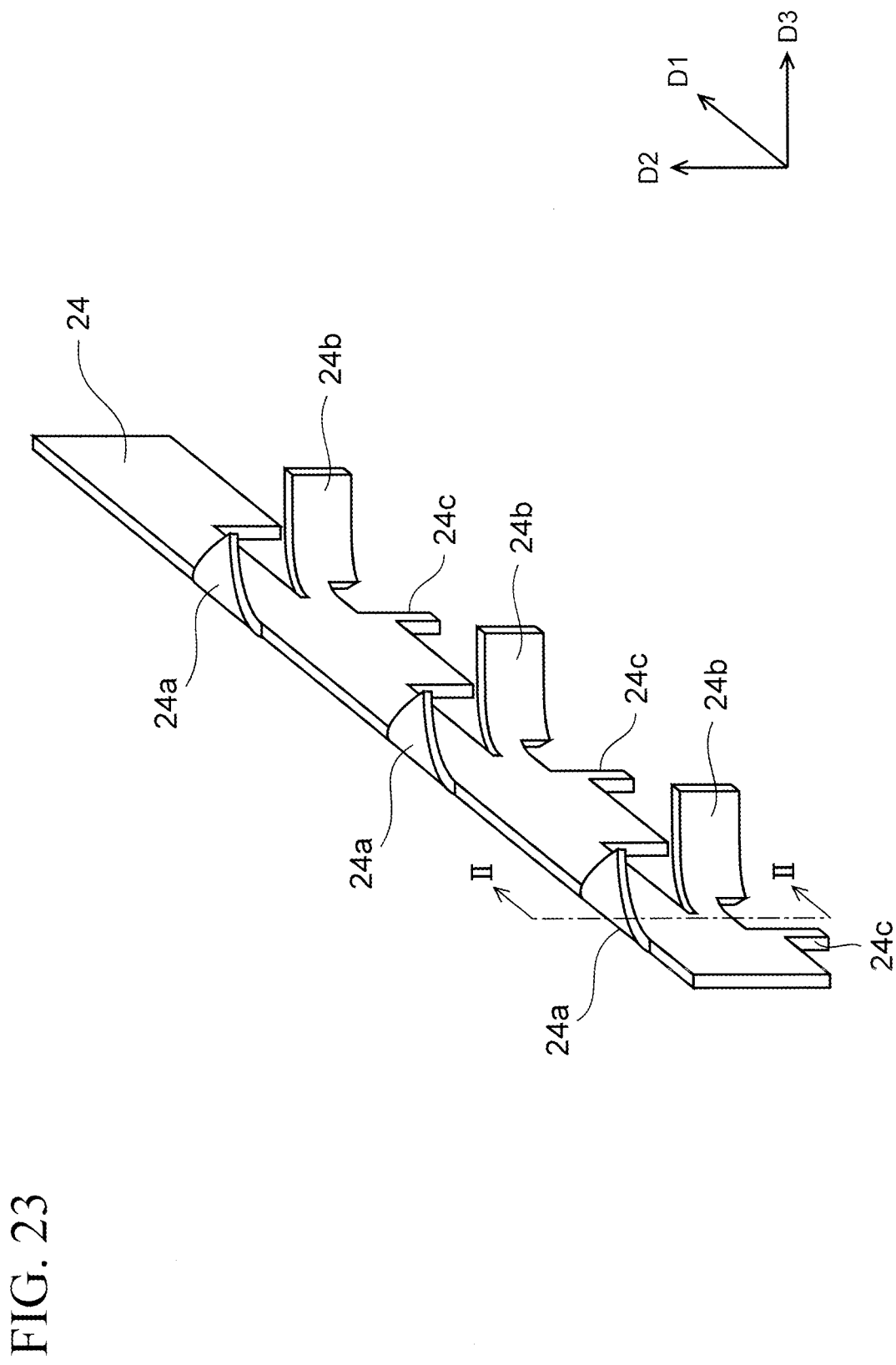
FIG. 23 is a perspective view of a first shield plate provided in the socket for semiconductor component according to the third embodiment.

FIG. 23 is a perspective view of the first shield plate 24 according to the present embodiment.

As in the second embodiment, the second contacts 24c are provided in a lower portion of the first shield plate 24. Further, both the first contacts 24a and the first bent portions 24b are directed in the normal direction D3 of the first shield plate 24.

Figure 24:
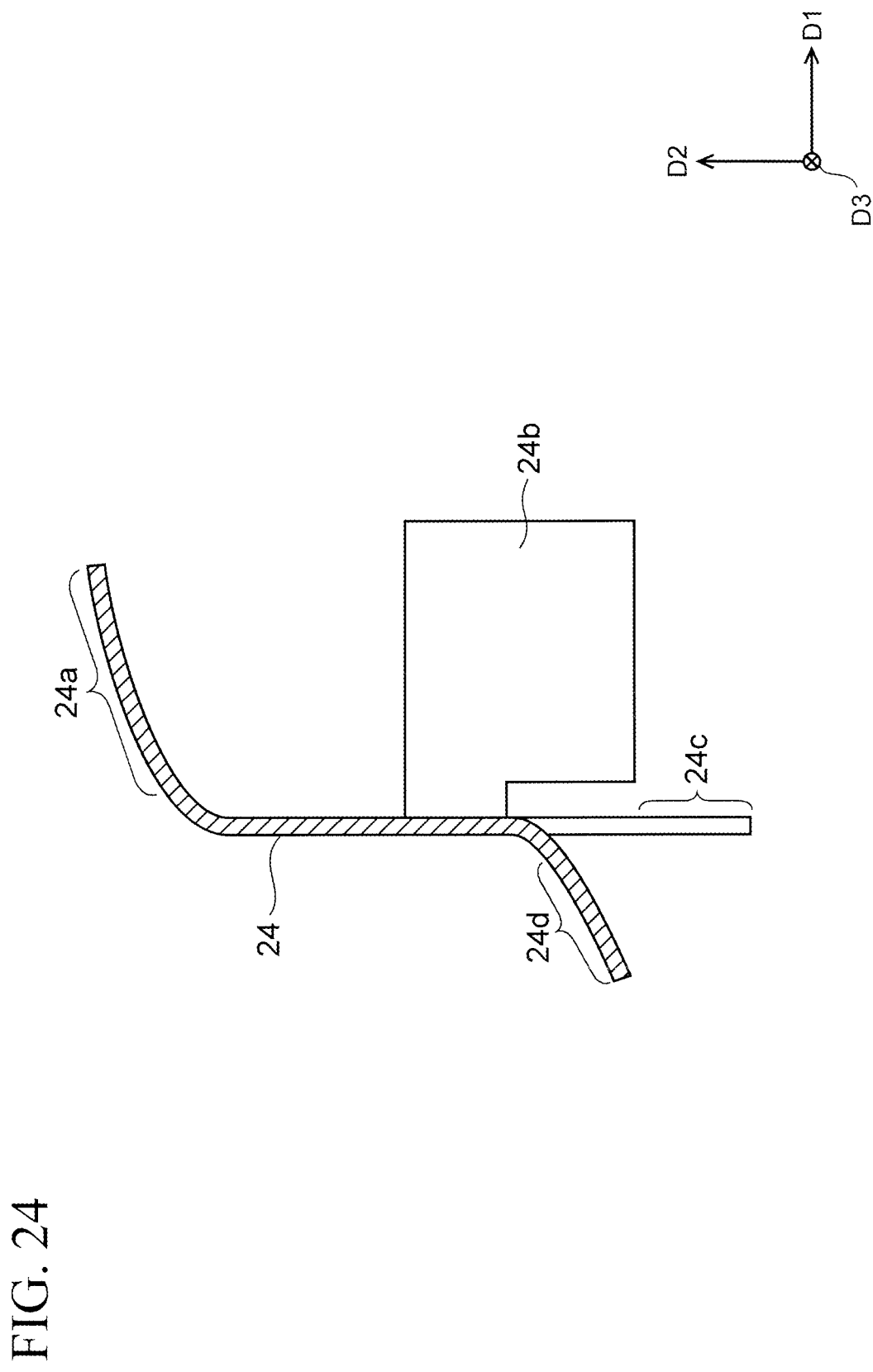
FIG. 24 is a partially cross-sectional side view taken along line II-II of FIG. 23.

FIG. 24 is a partially cross-sectional side view taken along line II-II of FIG. 23.

As illustrated in FIG. 24, third bent portions 24d are provided in a lower portion of the first shield plate 24. The third bent portions 24d are provided by bending portions of the first shield plate 24 and directed in a direction opposite to that of the first contacts 24a.

Figure 25:
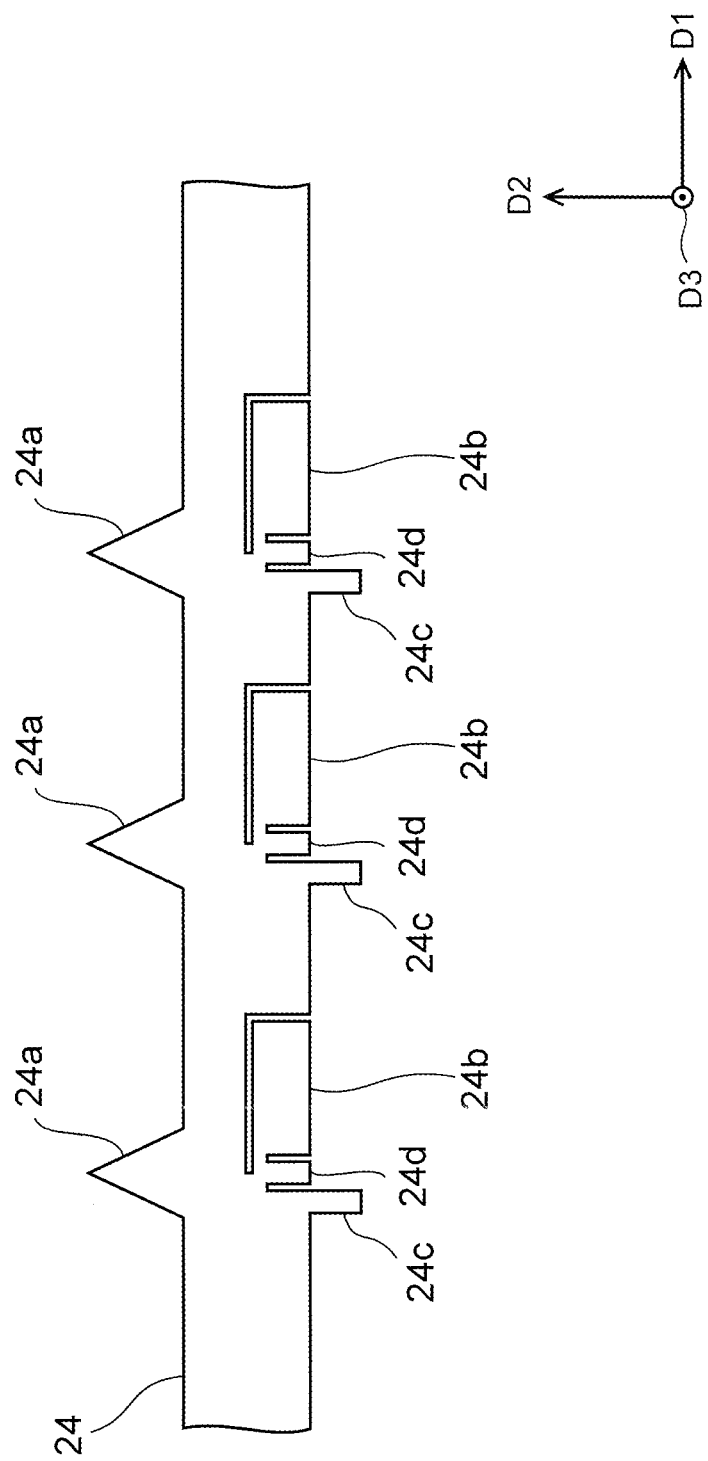
FIG. 25 is a developed view of the first shield plate provided in the socket for semiconductor component according to the third embodiment.

FIG. 25 is a developed view of the first shield plate 24.

As illustrated in FIG. 25, the first shield plate 24 is formed from a copper plate extending in its longitudinal direction D1. Further, the first contacts 24a, the first bent portions 24b, the second contacts 24c, and the third bent portions 24d are provided integrally with the copper plate.

Figure 26:
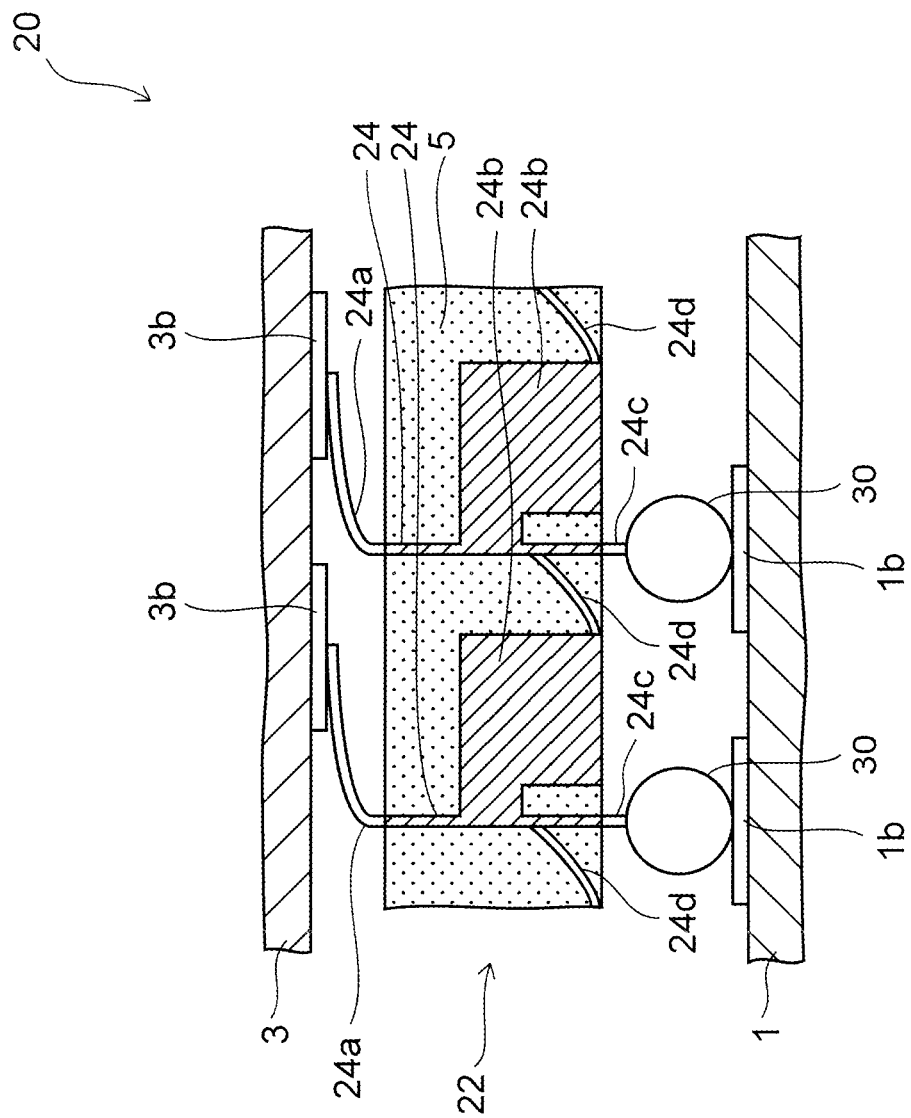
FIG. 26 is a partially cross-sectional side view of an information processing apparatus according to the third embodiment.

FIG. 26 is a partially cross-sectional side view of an information processing apparatus 20 including the socket 22 for the semiconductor component according to the present embodiment.

As in the second embodiment, the second contacts 24c of the first shield plates 24 protrude from the bottom surface of the insulator 5. Further, solder bumps 30 are fixed to the second contacts 24c, and the ground electrodes 1b and the first shield plates 24 are electrically connected through the solder bumps 30.

Moreover, in the present embodiment, the aforementioned third bent portions 24d are brought into contact with an adjacent first shield plate 24 so that the adjacent first shield plates 24 are electrically connected.

According to the present embodiment, since the adjacent first shield plates 24 are electrically connected through the third bent portions 24d as illustrated in FIG. 26, differences between the electric potentials of the shield plates 24 are reduced, and adjacent shield plates 24 can be reliably grounded.

Fourth Embodiment

In the second and third embodiments, the semiconductor component 3 is attachable to and detachable from the socket 22, because the signal electrodes 3a of the semiconductor component 3 are merely in contact with the terminals 23 as illustrated in, for example, FIG. 20.

Meanwhile, in the present embodiment, the semiconductor component 33 is fixed to the socket 22 for the semiconductor component as described below.

Figure 27:
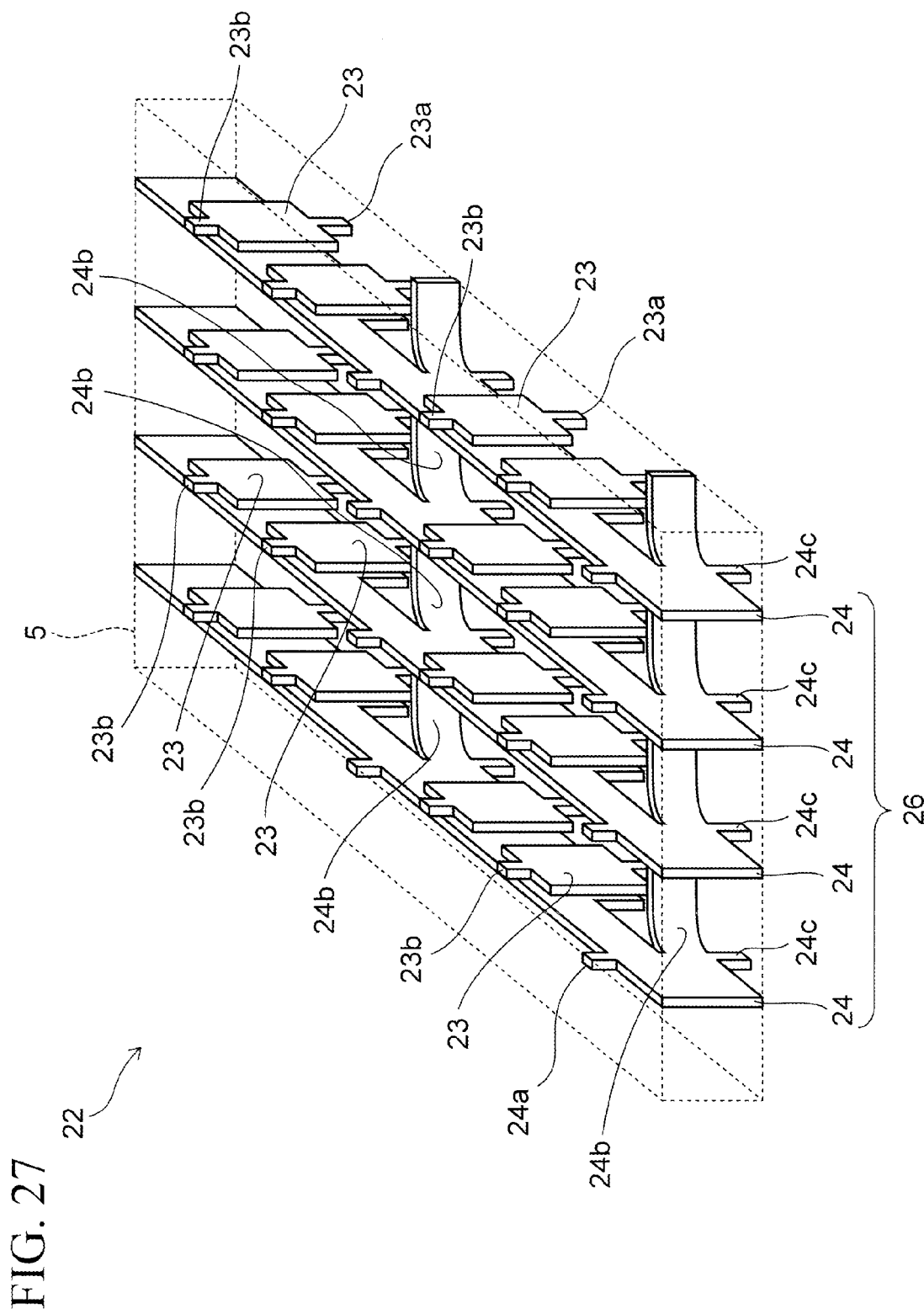
FIG. 27 is a schematic perspective view of a socket for semiconductor component according to a fourth embodiment.

FIG. 27 is a schematic perspective view of the socket for the semiconductor component according to the present embodiment.

It should be noted that in FIG. 27, the same components as those described in the first to third embodiments are denoted by the same reference numerals as those in these embodiments, and will not be further described below. This is also the case for FIGS. 27 and 28 described below.

As illustrated in FIG. 27, in the socket 22 for the semiconductor component according to the present embodiment, the shield 26 is formed of a plurality of the first shield plates 24, and the terminals 23 are electromagnetically shielded with the shield 26, as in the second and third embodiments.

Moreover, in the present embodiment, each of the first contacts 24a of the first shield plates 24 has the shape of a rectangular strip, and the first contacts 24a are protruded from the top surface of the plate-shaped insulator 5. Similar to this, second protrusions 23b each having the shape of a rectangular strip are provided in the terminals 23, and the second protrusions 23b are protruded from the top surface of the insulator 5.

Figure 28:
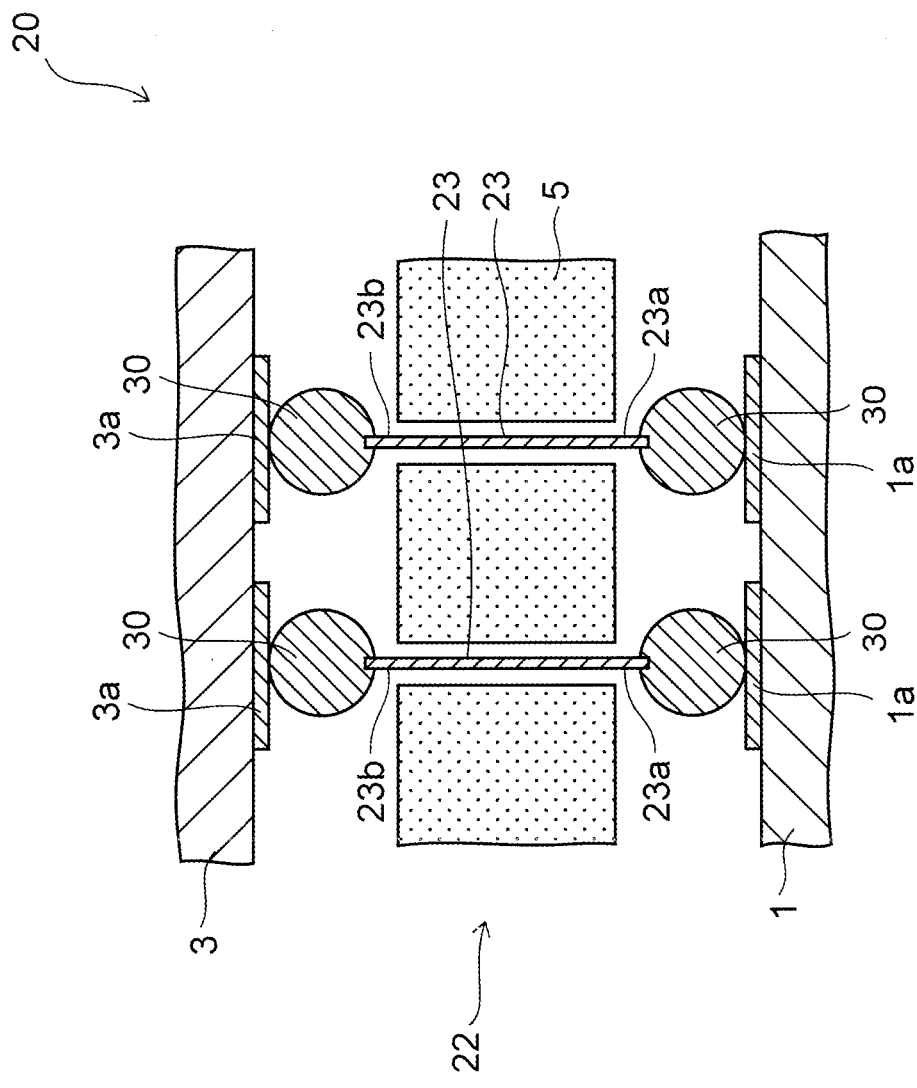
FIG. 28 is an enlarged cross-sectional view of an information processing apparatus according to the fourth embodiment.

FIG. 28 is an enlarged cross-sectional view of an information processing apparatus 20 including this socket 22 for the semiconductor component.

As in the second embodiment, the first protrusions 23a of the terminals 23 are fixed to the signal electrodes 1a of the printed circuit board 1 with solder bumps 30.

Further, solder bumps 30 are also fixed to the second protrusions 23b of the terminals 23, and the terminals 23 are fixed to the signal electrodes 3a of the semiconductor component 3 with the solder bumps 30.

Figure 29:
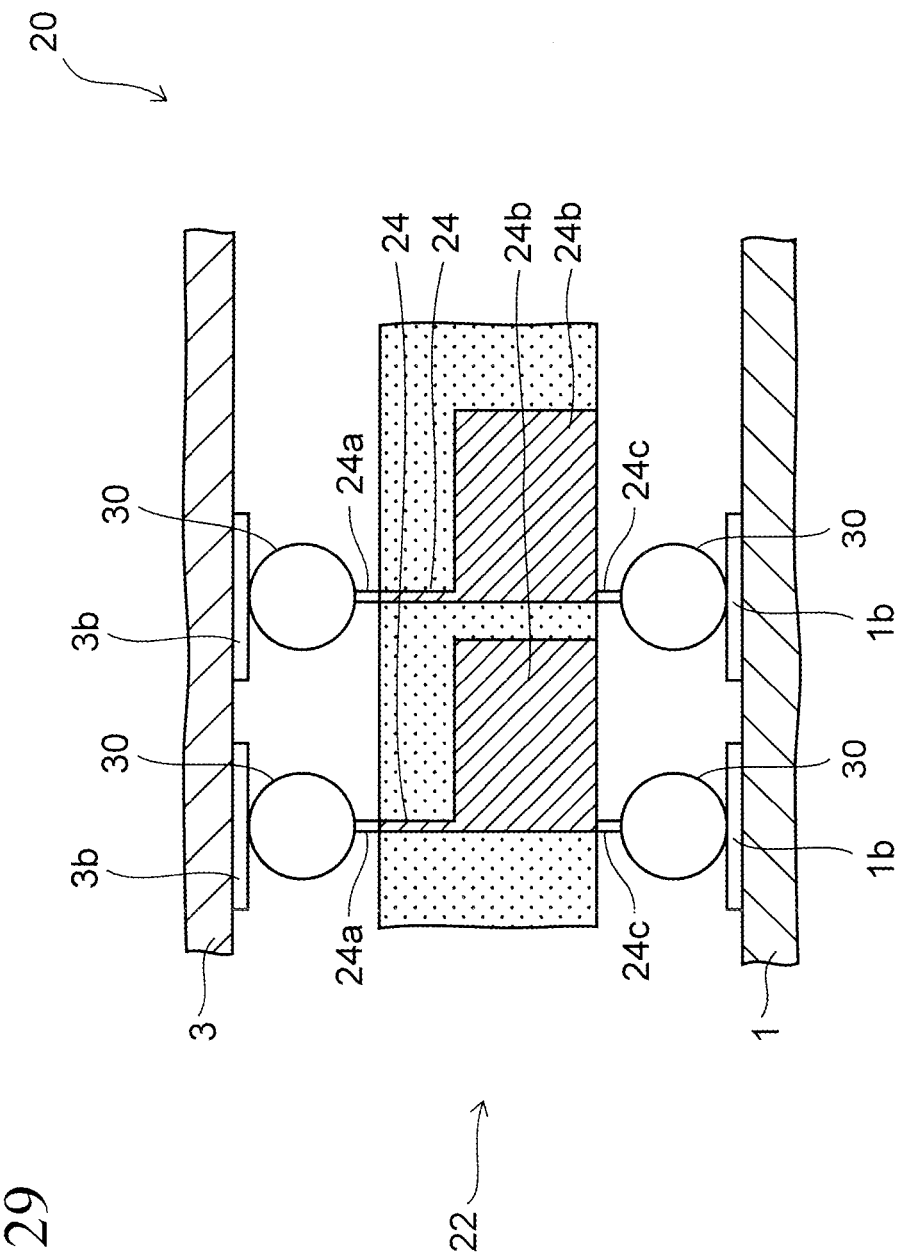
FIG. 29 is a partially cross-sectional side view which illustrates an insulator and surroundings thereof and which is taken along a cross section different from that of FIG. 28.

FIG. 29 is a partially cross-sectional side view which illustrates the insulator 5 and its surroundings, which is taken along a cross section different from that of FIG. 28.

As illustrated in FIG. 29, a solder bump 30 is fixed to each of the first contacts 24a and the second contacts 24c of the first shield plates 24. Further, the first shield plates 24 are fixed to the ground electrodes 1b and 3b of the printed circuit board 1 and the semiconductor component 3 with the solder bumps 30.

In the above-described present embodiment, the first shield plates 24 are fixed to the ground electrodes 3b of the semiconductor component 3 as illustrated in FIG. 29. Accordingly, compared to the second and third embodiments, in which the first shield plates 24 are fixed only to the printed circuit board 1, the first shield plates 24 can be reliably maintained at the ground potential, and the fluctuation of the electric potentials of the first shield plates 24 can be reduced.

Other Embodiment

In the first embodiment, the first shield plates 24 and the second shield plates 25 are respectively protruded from the first main surface 5x and the second main surface 5y of the insulator 5 as illustrated in FIG. 8. However, such a structure may be employed in which the shield plate is protruded from only one main surface of the insulator 5.

Figure 30:
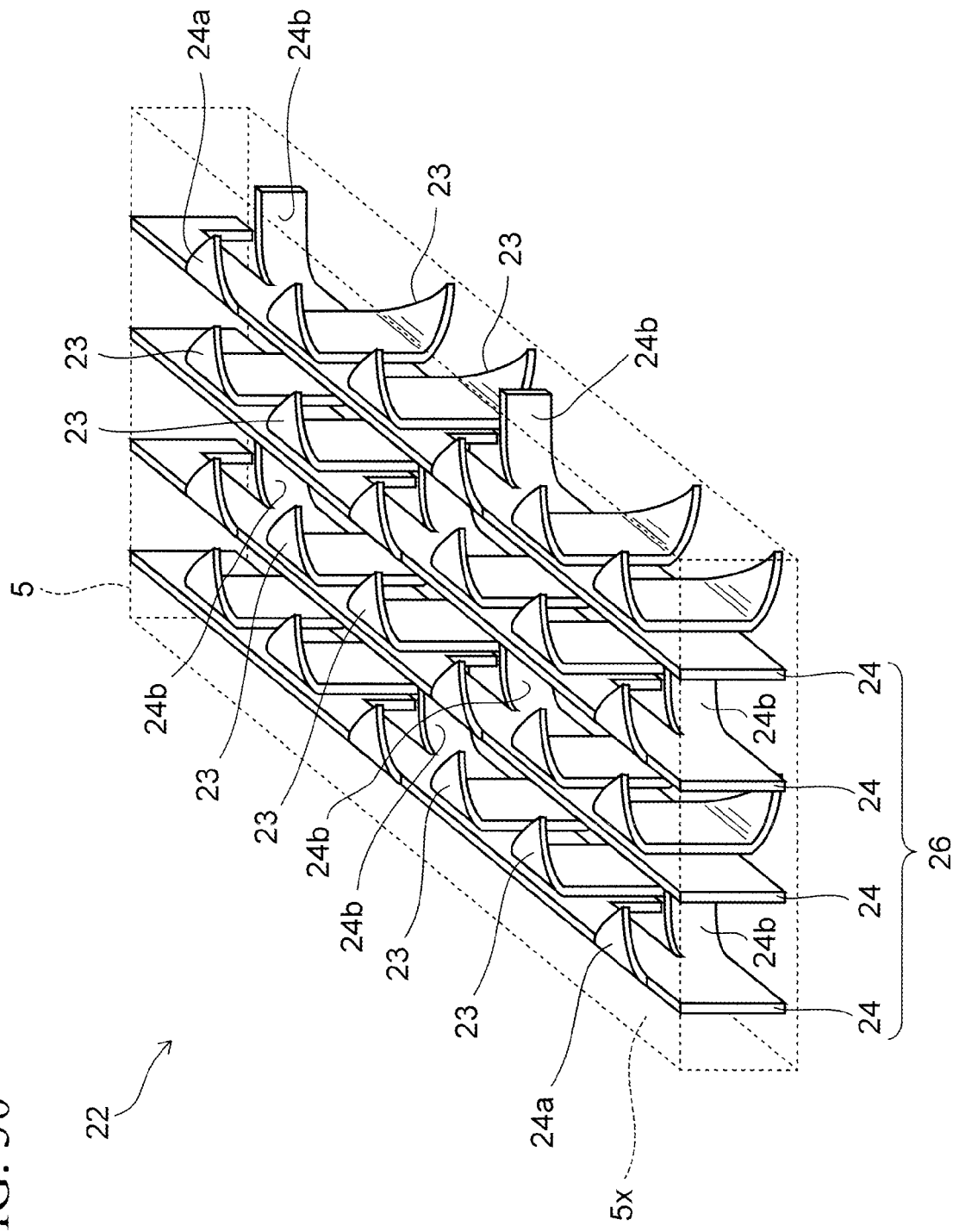
FIG. 30 is a schematic perspective view of a socket for semiconductor component according to another embodiment.

FIG. 30 is a schematic perspective view of the socket 22 for the semiconductor component for the case where the shield 26 is formed only by the first shield plates 24 with the first contacts 24a of the first shield plates 24 being protruded only from the first main surface 5x of the insulator 5.

In this case, again, the terminals 23 are surrounded by the first shield plates 24 and their first bent portions 24b so that the terminals 23 can be shielded.

It should be noted that in this case, the first contacts 24a of the first shield plates 24 are brought into contact with the ground electrodes 3b of the semiconductor component 3 (see FIG. 8), so that the first shield plates 24 are at the ground potential.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A socket for a semiconductor component comprising:
   a plate-shaped insulator having a first main surface and a second main surface, where the first main surface and the second main surface being a top surface and a bottom surface of the insulator, and a through hole being formed in the insulator;
   a terminal inserted in the through hole, the terminal having one end configured to be connected to a signal electrode of the semiconductor component and having another end configured to be connected to a signal electrode of a printed circuit board; and
   a shield buried in the insulator to surround the terminal from sides of the terminal, the shield including a first contact protruding from the first main surface and configured to be connected to a ground electrode of the semiconductor component, and a second contact protruding from the second main surface and configured to be connected to a ground electrode of the printed circuit board.

2. The socket for the semiconductor component according to claim 1, wherein the shield includes:
   a first shield plate buried in the insulator from the first main surface, the first shield plate including the first contact; and
   a second shield plate buried in the insulator from the second main surface, the second shield plate including the second contact.

3. The socket for the semiconductor component according to claim 2, wherein the first shield plate and the second shield plate are parallel to each other, a portion of the first shield plate is bent to be a bent portion directed toward the second shield plate, so that the terminal is surrounded by the first shield plate, the second shield plate, and the bent portion.

4. The socket for the semiconductor component according to claim 2, wherein the first contact is bent to be directed in a normal direction of the first shield plate, and the second contact is bent to be directed in a normal direction of the second shield plate.

5. The socket for the semiconductor component according to claim 1, wherein a solder bump is fixed to at least one of the first contact and the second contact.

6. The socket for the semiconductor component according to claim 1, wherein
   the shield is formed of a plurality of shield plates buried in the insulator, and
   a portion of the shield plate is bent to be a bent portion, and the shield plates adjacent to each other are connected with the bent portion.

7. The socket for the semiconductor component according to claim 1, wherein the number of the terminals is two, and each of the terminals is supplied with a differential signal.

8. A printed circuit board unit comprising:
   a printed circuit board; and
   a socket connected to the printed circuit board, wherein the socket includes:
      a plate-shaped insulator having a first main surface and a second main surface, where the first main surface and the second main surface being a top surface and a bottom surface of the insulator, and a through hole being formed in the insulator;
      a terminal inserted in the through hole, the terminal having an end connected to a signal electrode of the printed circuit board; and
      a shield buried in the insulator to surround the terminal from sides of the terminal, the shield including a first contact protruding from the first main surface and a second contact protruding from the second main surface and connected to a ground electrode of the printed circuit board.

9. An information processing apparatus comprising:
   a printed circuit board;
   a semiconductor component; and
   a socket connected to the printed circuit board, the semiconductor component being attached to the socket wherein the socket includes:
      a plate-shaped insulator having a first main surface and a second main surface, where the first main surface and the second main surface being a top surface and a bottom surface of the insulator, and a through hole being formed in the insulator;
      a terminal inserted in the through hole, the terminal having one end connected to a signal electrode of the semiconductor component and having another end connected to a signal electrode of the printed circuit board; and
      a shield buried in the insulator to surround the terminal from sides of the terminal, the shield including a first contact protruding from the first main surface and connected to a ground electrode of the semiconductor component and a second contact protruding from the second main surface and connected to a ground electrode of the printed circuit board.

* * * * *